United States Patent
Yoo et al.

(10) Patent No.: US 10,866,149 B1
(45) Date of Patent: Dec. 15, 2020

(54) SYSTEM AND METHOD FOR NONDESTRUCTIVE DETECTION OF STRUCTURAL IRREGULARITIES USING A DIRECTIONAL MAGNETOSTRICTIVE PHASED ARRAY SENSOR WITH A COMB-SHAPED MAGNETOSTRICTIVE PATCH

(71) Applicant: UNIVERSITY OF MARYLAND, COLLEGE PARK, College Park, MD (US)

(72) Inventors: Byungseok Yoo, Olney, MD (US); Darryll J. Pines, Clarksville, MD (US)

(73) Assignee: University of Maryland, College Park, College Park, MD (US)

( * ) Notice: Subject to any disclaimer, the term of this patent is extended or adjusted under 35 U.S.C. 154(b) by 315 days.

(21) Appl. No.: 15/926,698

(22) Filed: Mar. 20, 2018

Related U.S. Application Data

(60) Provisional application No. 62/474,685, filed on Mar. 22, 2017.

(51) Int. Cl.
*G01L 1/12* (2006.01)
*G01H 11/04* (2006.01)
(Continued)

(52) U.S. Cl.
CPC .............. *G01L 1/125* (2013.01); *G01H 11/04* (2013.01); *G01N 29/041* (2013.01);
(Continued)

(58) Field of Classification Search
CPC .. G01L 1/125; G01N 29/041; G01N 29/2412; G01N 27/82; G01H 11/04; H01L 41/125; G01R 33/18; G01D 5/485
See application file for complete search history.

(56) References Cited

U.S. PATENT DOCUMENTS 5,581,037 A   12/1996 Kwun et al.
5,708,216 A *  1/1998 Garshelis ............... G01L 3/102
                                                   73/862.333
(Continued)

FOREIGN PATENT DOCUMENTS

WO      2005084358 A2    9/2005

OTHER PUBLICATIONS

A. Aharoni, "Demagnetizing factors for rectangular ferromagnetic prisms." J. Appl. Phys., vol. 83, No. 6 (Mar. 1998), p. 3432-34. doi: 10.1063/1.367113.
(Continued)

*Primary Examiner* — Herbert K Roberts
(74) *Attorney, Agent, or Firm* — Rosenberg, Klein & Lee

(57) ABSTRACT

A compact directional high resolution magnetostrictive phased array sensor (MPAS) includes a magnetostrictive comb-shaped patch and a magnetic circuit device. The patch was machined with 24 comb fingers along its radial direction. The magnetic circuit device contains a sensing array of angularly spaced apart sensing coils and cylindrical biasing magnets. The individual sensing coils have distinct directional sensing preferences designated by the normal direction of the coil winding. The directional sensing feature of the developed MPAS is supported by the combined effect of the magnetic shape anisotropy of the comb finger formation in the patch and the sensing directionality of the sensing array. The MPAS detects the strain-induced magnetic property change on the comb-shaped patch due to the mechanical interaction between the patch and GLWs propagating in the structure under study. The array sensor enables to acquire signal data from different sensing sections within the patch by altering the rotational orientation of the magnetic circuit device.

20 Claims, 22 Drawing Sheets

(51) Int. Cl.
*G01N 29/04* (2006.01)
*G01N 29/44* (2006.01)
*G01N 29/24* (2006.01)
*H01L 41/12* (2006.01)

(52) U.S. Cl.
CPC ..... *G01N 29/2412* (2013.01); *G01N 29/4454* (2013.01); *H01L 41/125* (2013.01)

(56) References Cited

U.S. PATENT DOCUMENTS

| | | | |
|---|---|---|---|
| 6,220,105 B1* | 4/2001 | Cripe | G01L 1/125 73/862.333 |
| 6,917,196 B2 | 7/2005 | Kwun et al. | |
| 6,924,642 B1 | 8/2005 | Cho et al. | |
| 7,215,118 B2 | 5/2007 | Park et al. | |
| 7,295,001 B2 | 11/2007 | Kim et al. | |
| 7,469,595 B2 | 12/2008 | Kessler et al. | |
| 7,533,578 B2 | 5/2009 | Kessler et al. | |
| 7,627,439 B1 | 12/2009 | Kessler et al. | |
| 7,997,139 B2 | 8/2011 | Owens et al. | |
| 8,305,074 B2 | 11/2012 | Lee et al. | |
| 8,354,842 B2 | 1/2013 | Kim et al. | |
| 8,745,864 B2 | 6/2014 | Kessler et al. | |
| 8,907,665 B2 | 12/2014 | Rose et al. | |
| 2001/0040450 A1* | 11/2001 | Li | G01R 33/02 324/260 |
| 2010/0217544 A1 | 8/2010 | Yan et al. | |
| 2010/0259252 A1* | 10/2010 | Kim | B06B 1/085 324/240 |
| 2012/0293289 A1* | 11/2012 | Laursen | G01N 27/82 335/306 |
| 2013/0327148 A1 | 12/2013 | Yan et al. | |
| 2014/0028154 A1 | 1/2014 | Vinogradov et al. | |
| 2014/0354388 A1* | 12/2014 | Kim | H01L 41/12 336/110 |
| 2015/0053009 A1 | 2/2015 | Yan et al. | |
| 2017/0254367 A1* | 9/2017 | Klassen | F16D 11/14 |
| 2018/0164256 A1* | 6/2018 | Vinogradov | G01N 29/043 |
| 2019/0079056 A1* | 3/2019 | Cegla | G01N 29/043 |

OTHER PUBLICATIONS

M. Engholm & T. Stepinski, "Direction of arrival estimation of Lamb waves using circular arrays." Struct. Health Monit., vol. 10, No. 5 (Aug. 2010), pp. 467-480. doi: 10.1177/1475921710379512.

E. B. Flynn, et al., "Identifying scatter targets in 2D space using in situ phased-arrays for guided wave structural health monitoring." Proc. 8th International workshop on Structural Health Monitoring, Stanford University, Sep. 13-15, 2011.

V. Giurgiutiu, "Structural Health Monitoring with Piezoelectric Wafer Active Sensors." Academic Press (2007), pp. 239-307.

S. Gopalakrishnan, et al., "Computational Techniques for Structural Health Monitoring." Springer (2011), pp. 21-25.

H.W. Kim, et al., "Circumferential phased array of shear-horizontal wave magnetostrictive patch transducers for pipe inspection." Ultrasonics, vol. 53, No. 2 (Sep. 2013), pp. 423-431. doi: 10.1016/J.ULTRAS.2012.07.010.

K. Kim, et al., "Effects of slits in a patch of omnidirectional Lamb-wave MPT on the transducer output." Smart Mater. Struct. vol. 25, No. 3 (Feb. 2016), 035019. doi: 10.1088/0964-1726/25/3/035019.

Y.Y. Kim & Y.E. Kwon, "Review of magnetostrictive patch transducers and applications in ultrasonic nondestructive testing of waveguides." Ultrasonics, vol. 62 (Sep. 2015), pp. 3-19. doi: 10.1016/ J.ULTRAS.2015.05.015.

H. Kwun & K.A. Bartels, "Magnetostrictive sensor technology and its applications." Ultrasonics, vol. 36, Nos. 1-5 (Feb. 1998), pp. 171-178. doi: 10.1016/S0041-624X(97)00043-7.

J.K. Lee, et al., "Development and application of phased array system for defect imaging in plate-like structures." Trans. of the KSNVE, vol. 24, No. 2 (Feb. 2014), pp. 123-130. doi: 10.5050/KSNVE.2013.24.2.123.

J.K. Lee, et al., "Omnidirectional Lamb waves by axisymmetrically-configured magnetostrictive patch transducer." IEEE Trans. Ultrason., Ferroelec., Freq. Control, vol. 60, No. 9 (Sep. 2013), pp. 1928-1934. doi: 10.1109/TUFFC.2013.2777.

J. Rajagopalan, et al., "A phase reconstruction algorithm for Lamb wave based structural health monitoring of anisotropic multilayered composite plates." J. Acoust. Soc. Am. vol. 119, No. 2 (Feb. 2006) p. 872-878. doi: 10.1121/1.2149775.

K.I. Salas & C.E.S. Cesnik, "Guided wave excitation by a CLoVER transducer for structural health monitoring: theory and experiments." Smart Mater. Struct., vol. 18, No. 7 (Jun. 2009), 075005. doi: 10.1088/0964-1726/18/7/075005.

P. D. Wilcox, "Omni-directional guided wave transducer arrays for the rapid inspection of large areas of plate structures." IEEE Trans. Ultrason., Ferroelect., Freq. Control, vol. 50, No. 6 (Jun. 2003), pp. 699-709. doi: 10.1109/TUFFC.2003.1209557.

F. Yan, et al., "Ultrasonic guided wave imaging techniques in structural health monitoring." J. Intell. Mater. Syst. Struct., vol. 21, No. 3 (Feb. 2010), pp. 377-384. doi: 10.1177/1045389X09356026.

B. Yoo, et al., "Directional magnetostrictive patch transducer based on Galfenol's anisotropic magnetostriction feature." Smart Mater. Struct., vol. 23, No. 9 (Aug. 2014), 095035. doi: 10.1088/0964-1726/23/9/095035.

B. Yoo & D.J. Pines, "Enhancement of directional sensitivity of magnetostrictive phased array sensor using a circular comb-shaped nickel patch." AIP Advances, vol. 7, No. 5 (Jan. 2017), 056415. doi: 10.1063/1.4973951.

B. Yoo, et al., "Magnetic shape anisotropy effect on sensing performance and directional sensitivity in magnetostrictive nickel patch transducer." J. Intell. Mater. Syst. Struct., vol. 27, No. 8 (May 2016), pp. 1075-91. doi: 10.1177/1045389X15585895.

B. Yoo, et al., "Piezoelectric-paint-based two-dimensional phased sensor arrays for structural health monitoring of thin panels." Smart Mater. Struct. vol. 19, No. 7 (Jun. 2010), 075017. doi:10.1088/0964-1726/19/7/075017.

L. Yu, et al., "Omnidirectional guided wave PWAS phased array for thin-wall structure damage detection." Proc. SPIE, vol. 6529, Sensors and Smart Structures Technologies for Civil, Mechanical, and Aerospace Systems, San Diego, California (Apr. 10, 2007), 652939. doi: 10.1117/12.717738.

* cited by examiner

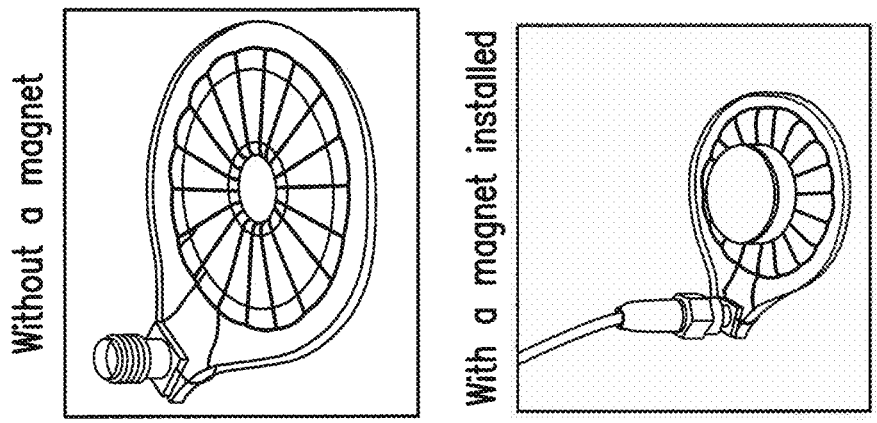
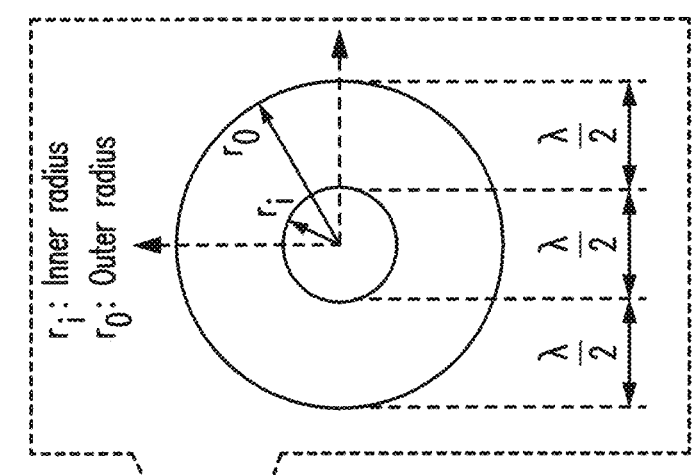
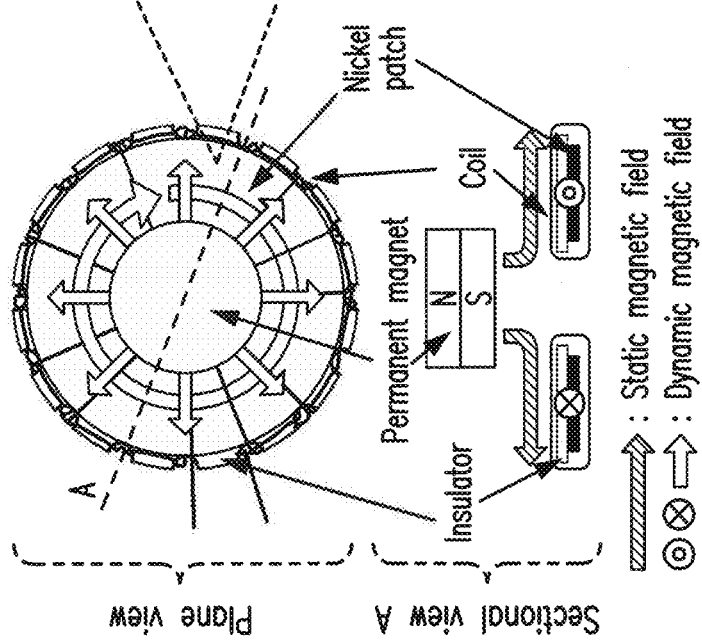
FIG. 1C  Prior Art

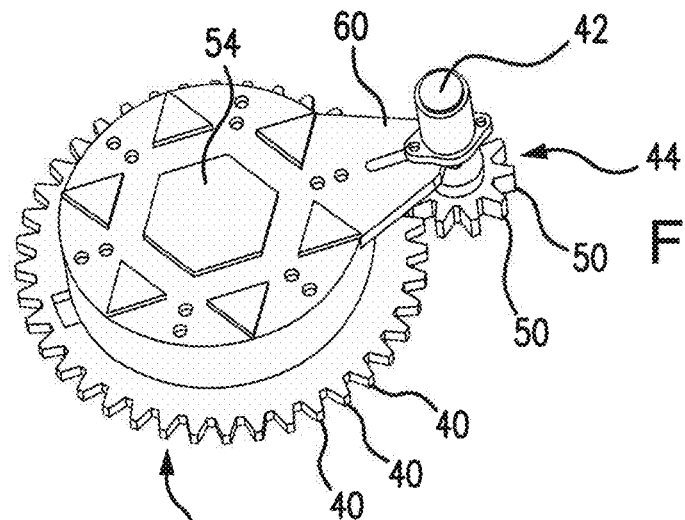
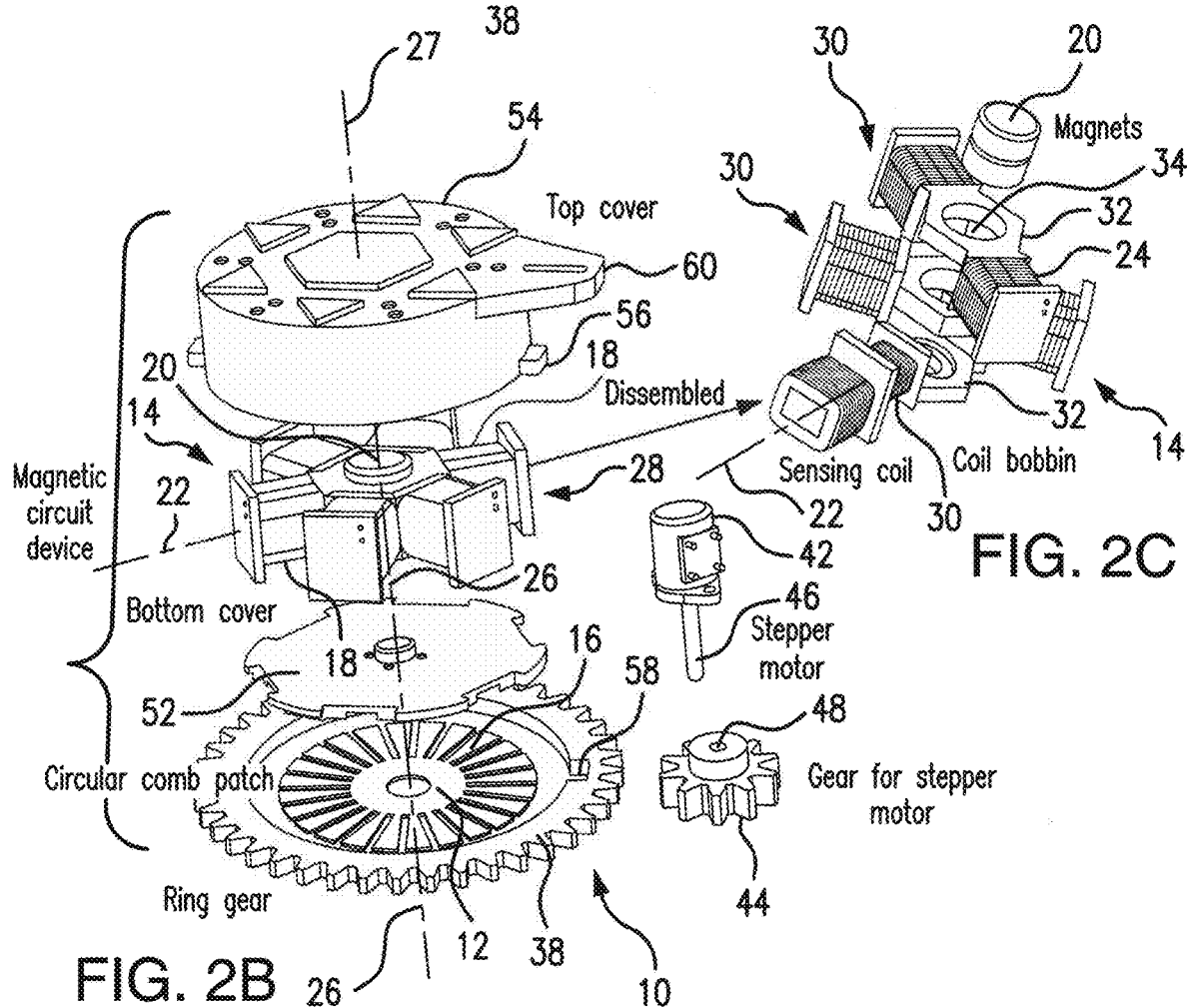

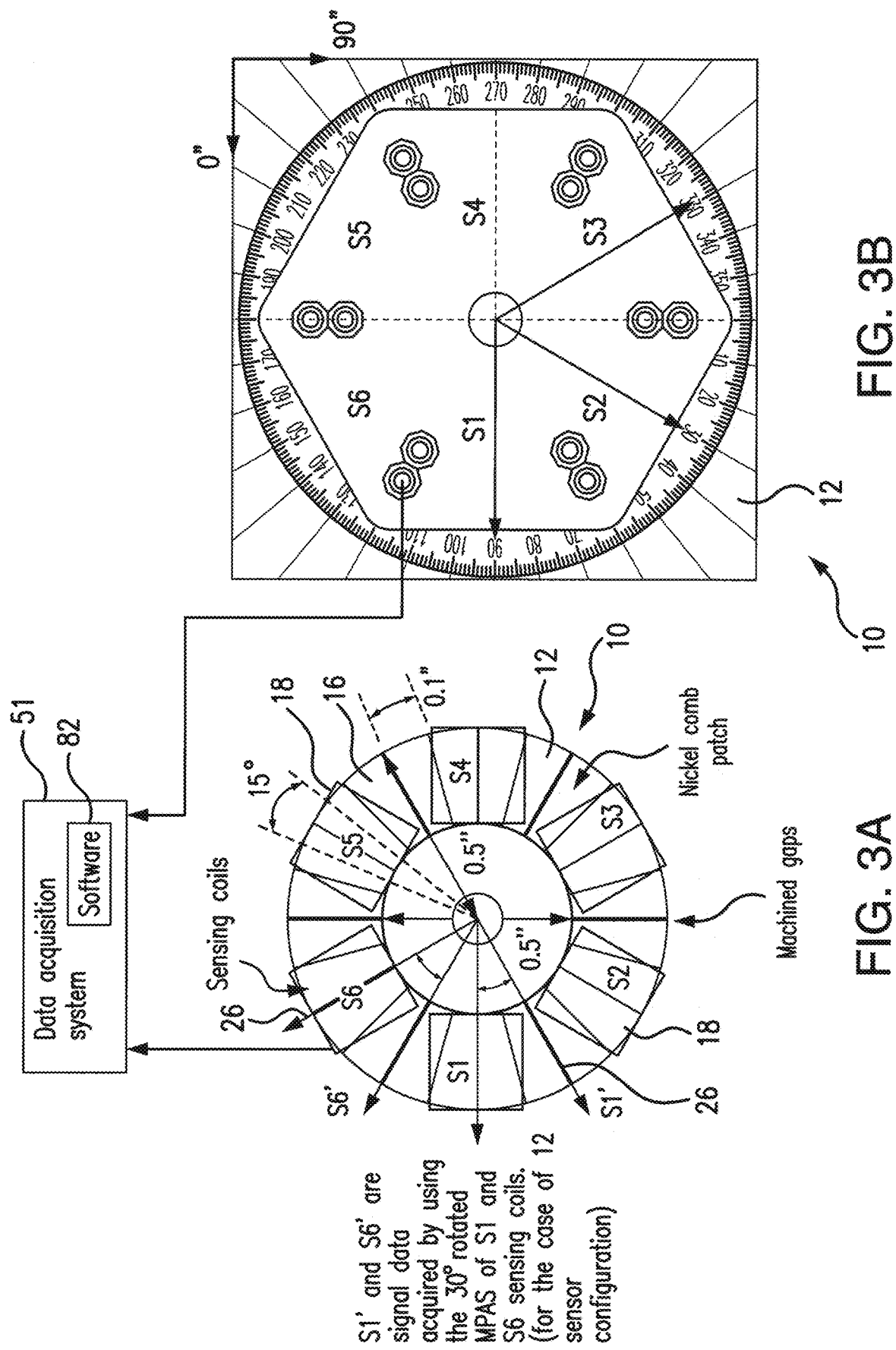

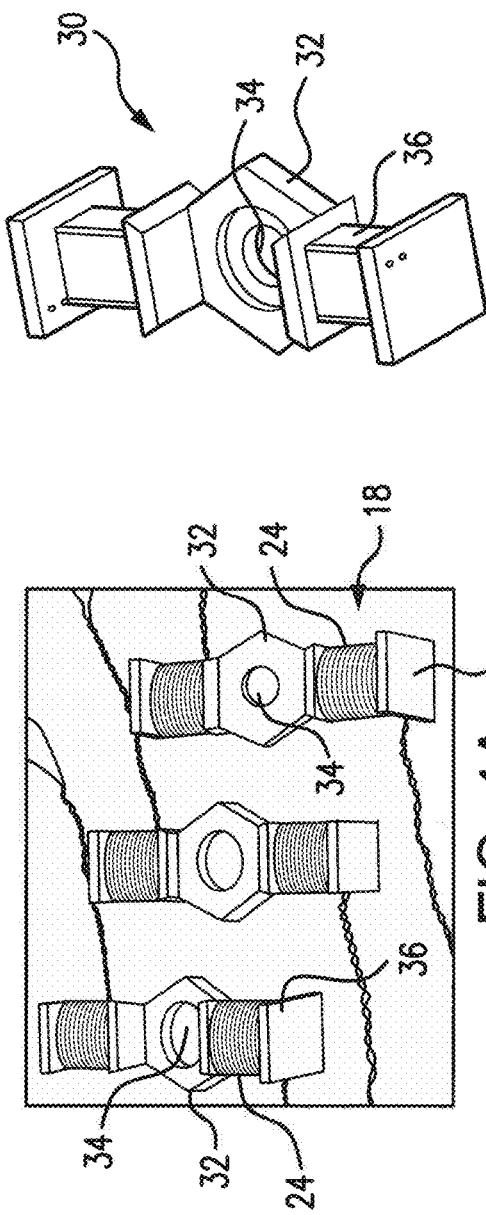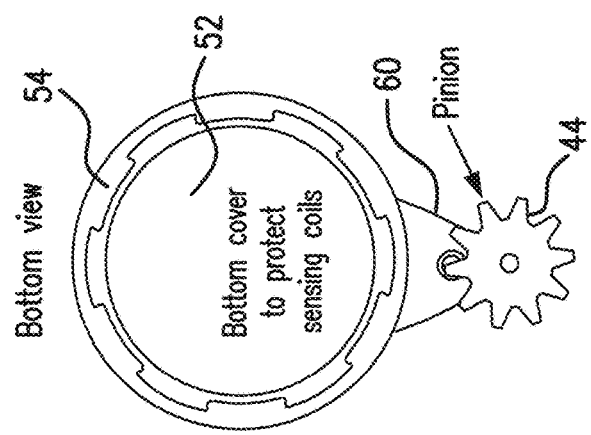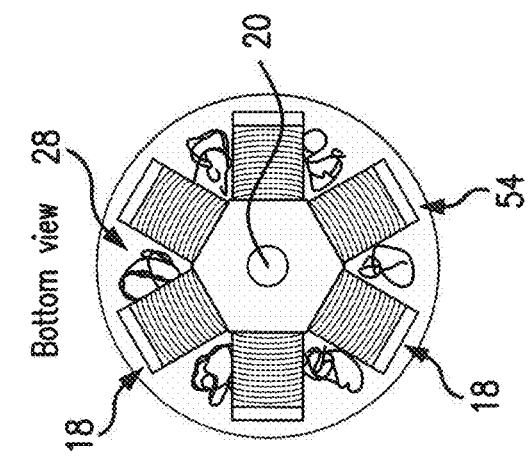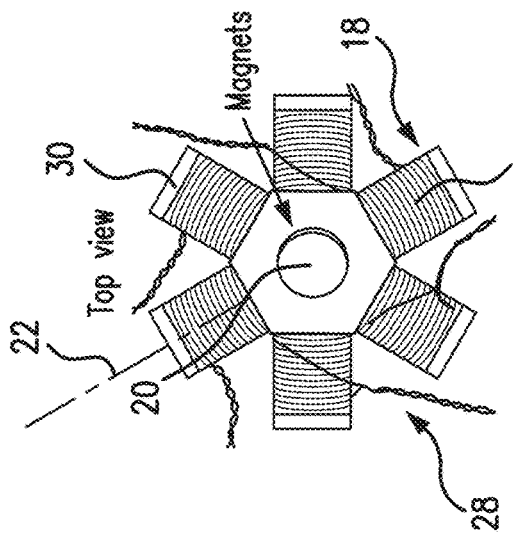

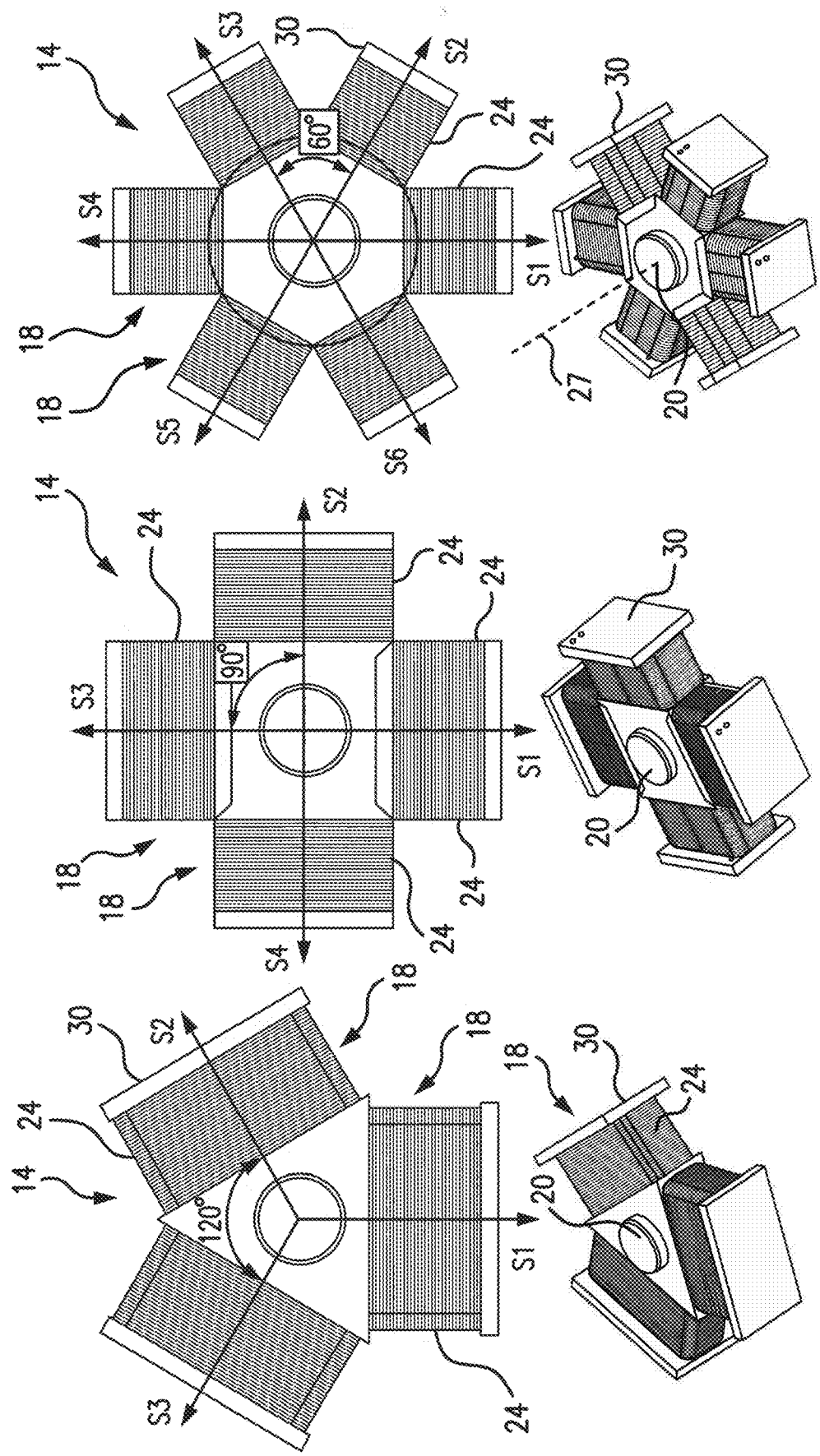

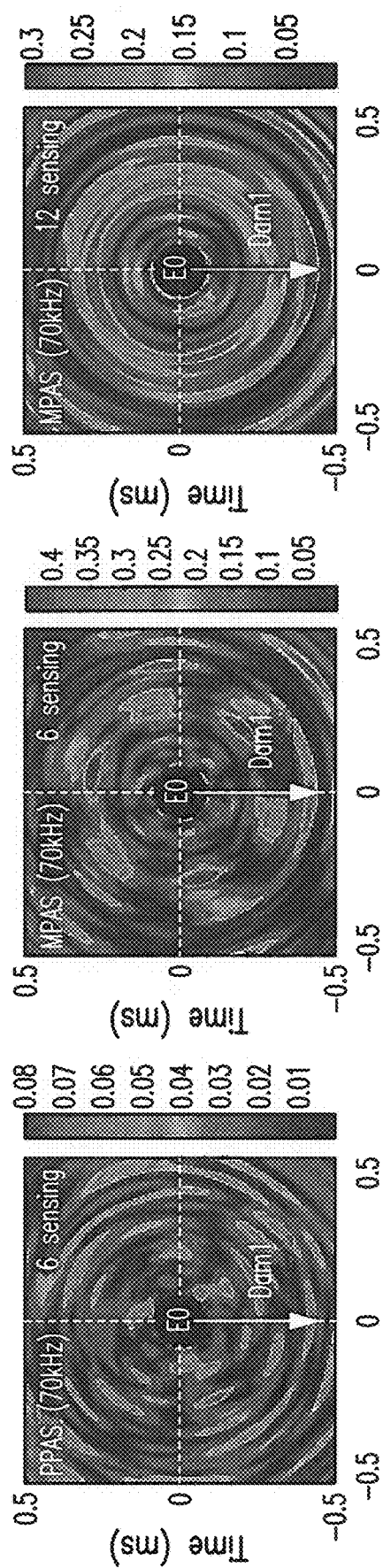
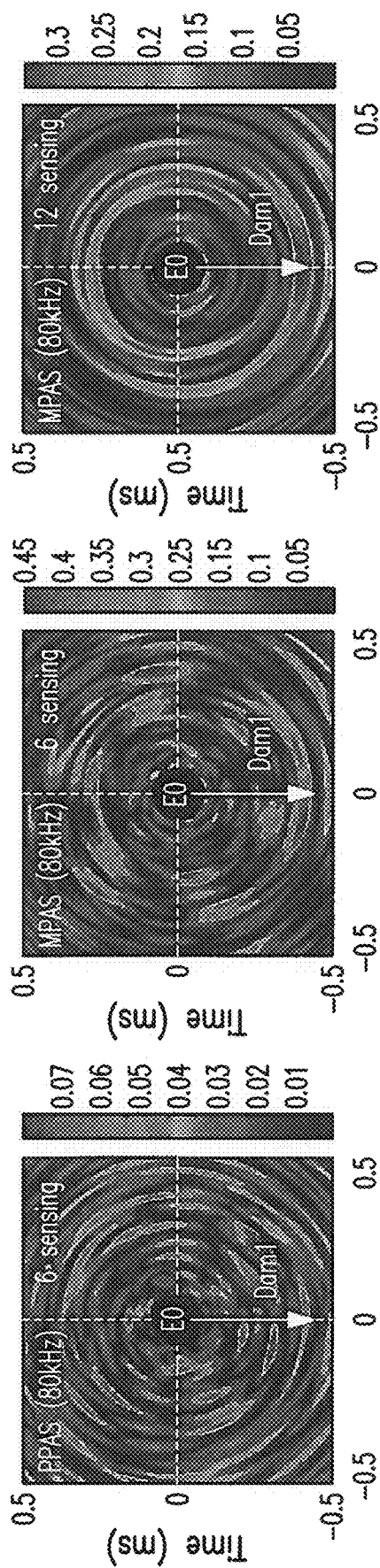
FIG. 13A  FIG. 13B  FIG. 13C
FIG. 13D  FIG. 13E  FIG. 13F

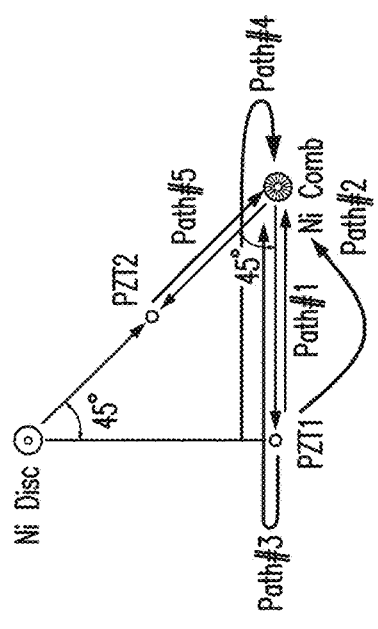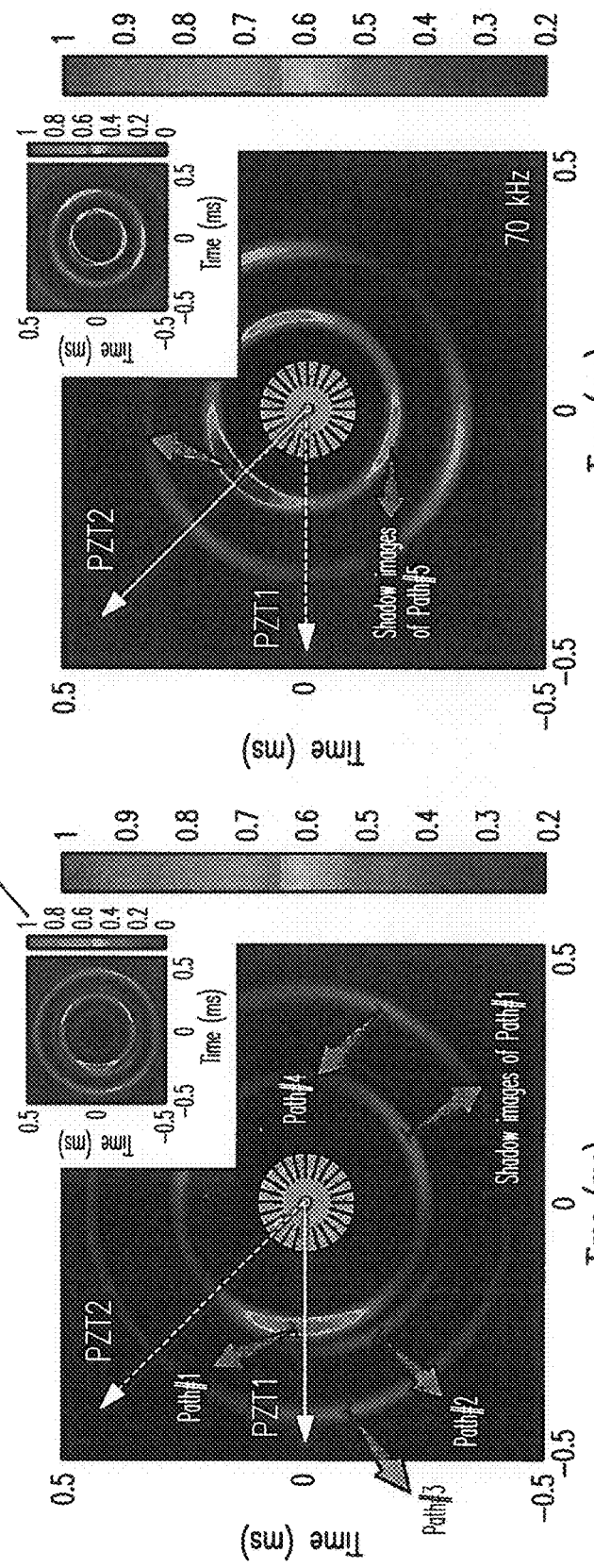
FIG. 18A
FIG. 18B
FIG. 18C

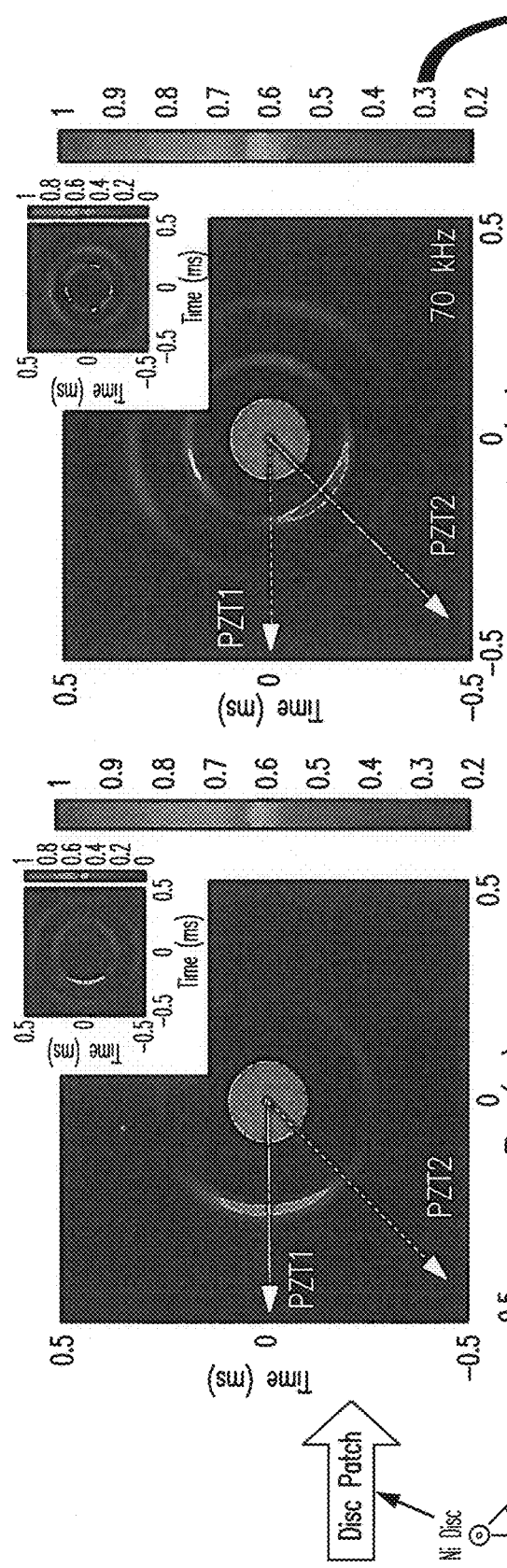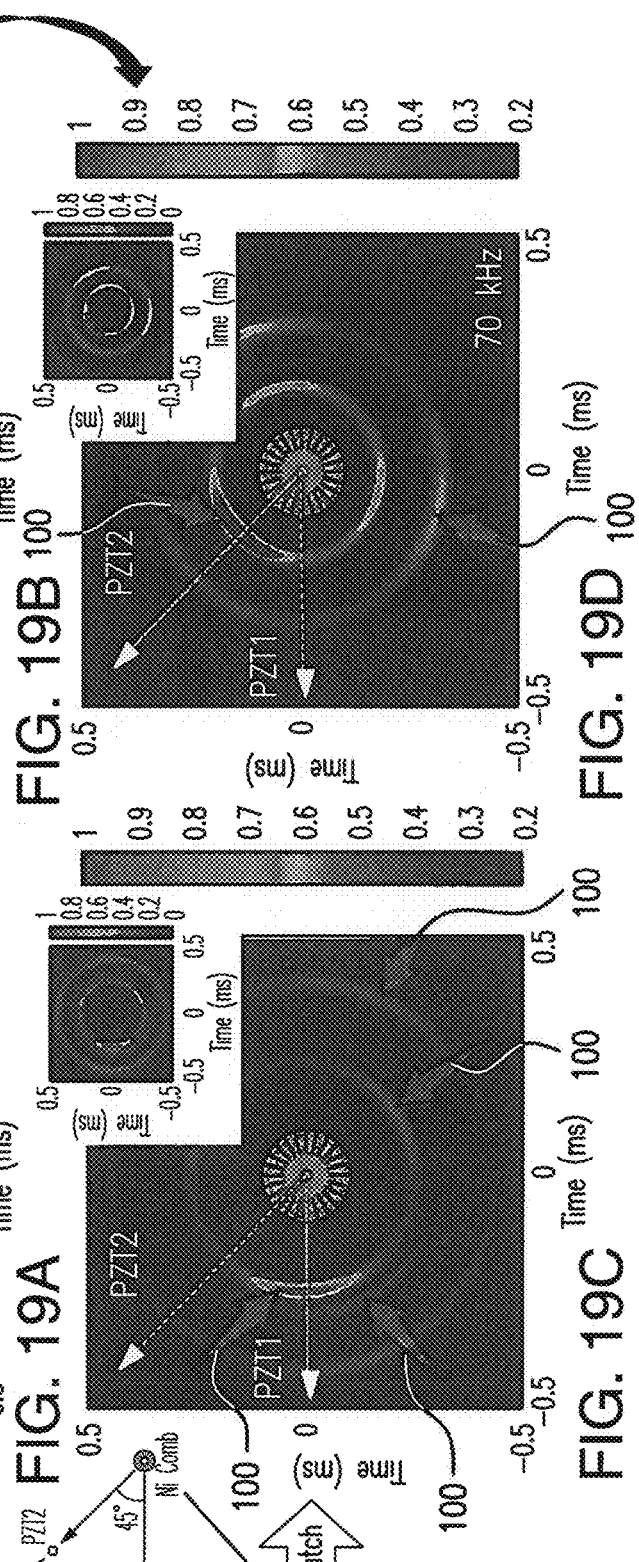
FIG. 19A  FIG. 19B  FIG. 19C  FIG. 19D

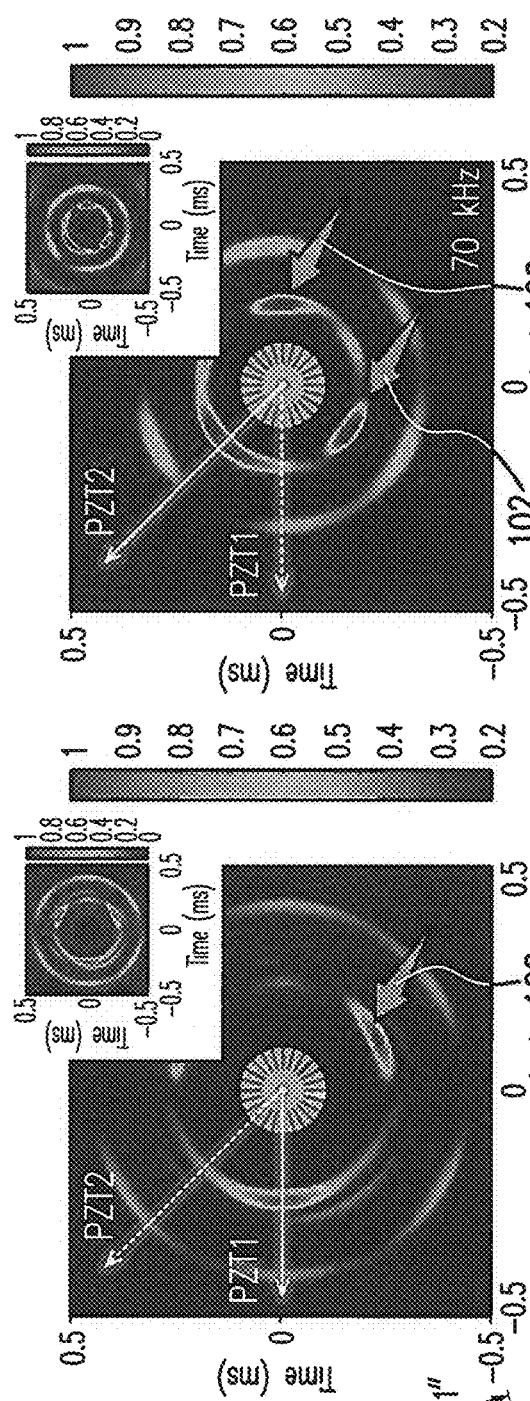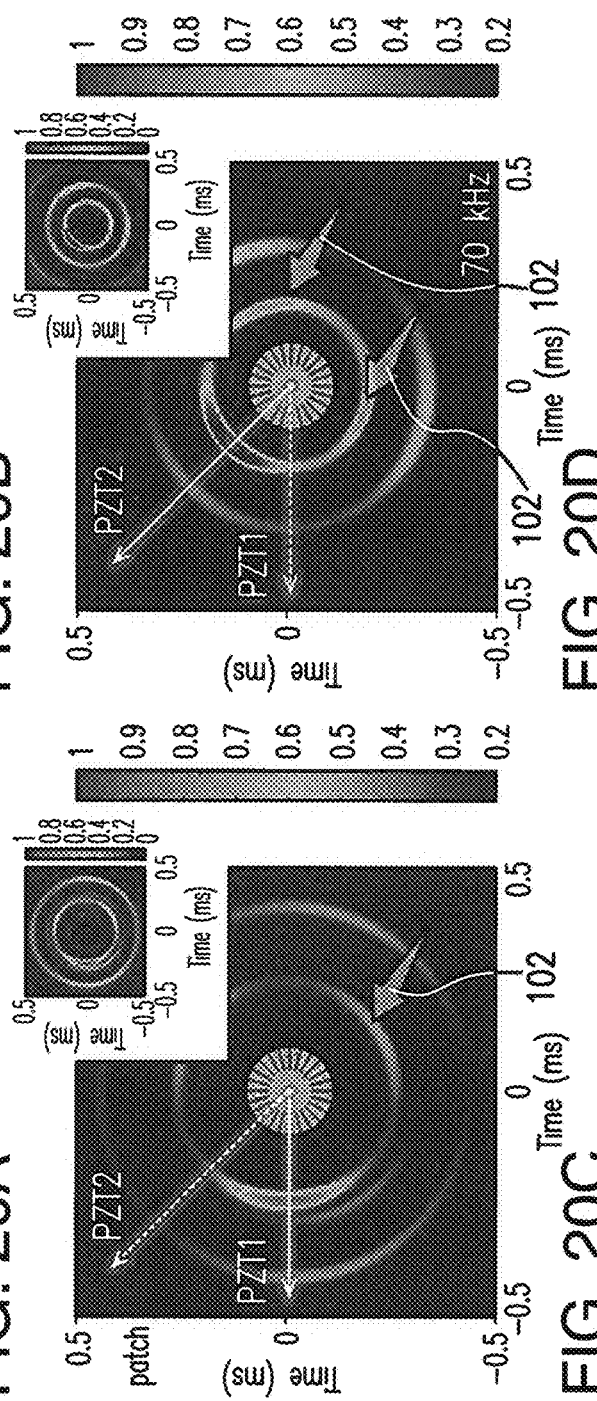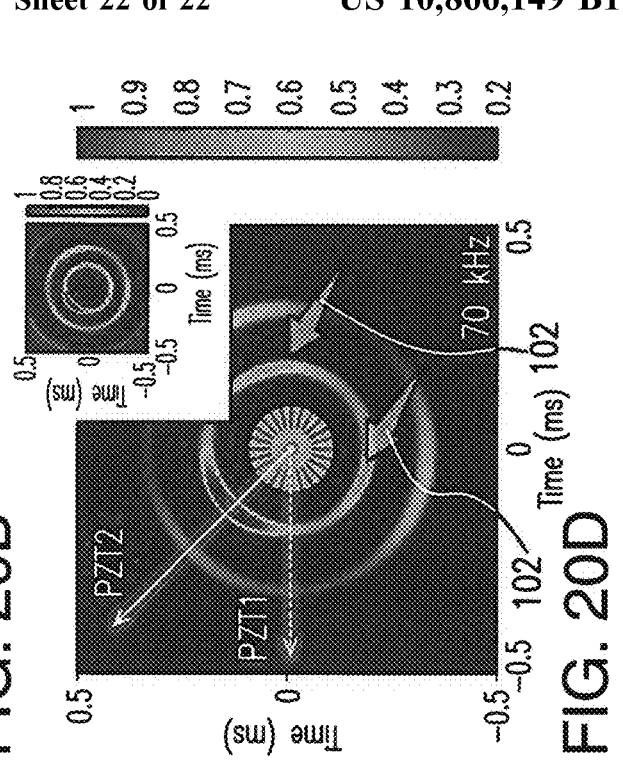
FIG. 20A  FIG. 20B  FIG. 20C  FIG. 20D

SYSTEM AND METHOD FOR NONDESTRUCTIVE DETECTION OF STRUCTURAL IRREGULARITIES USING A DIRECTIONAL MAGNETOSTRICTIVE PHASED ARRAY SENSOR WITH A COMB-SHAPED MAGNETOSTRICTIVE PATCH

REFERENCE TO RELATED PATENT APPLICATIONS

This Utility patent application is based on the Provisional Patent Application No. 62/474,685 filed 22 Mar. 2017, currently pending.

FIELD OF THE INVENTION

The present system relates to non-destructive detection of defects (irregularities) in various structures; and specifically to ultrasonic-based methodology for defects detection.

More in particular, the present system is directed to a damage detection system using a guided Lamb wave (GLW)-based magnetostrictive phased array sensor (MPAS).

The present invention is further directed to a compact and highly directional magnetostrictive phased array sensor using a circular comb-shaped magnetostrictive patch and a magnetic circuit device removably assembled with the comb-shaped magnetostrictive patch configured for detection of the strain-induced magnetic property change on the comb-shaped disc patch due to interaction between the comb-shaped magnetostrictive patch and guided Lamb waves propagating in the structure under test.

In addition, the present invention is directed to a highly directional magnetostrictive phased array sensor attaining precise detection of irregularities (defects) in structures under test through the use of a magnetostrictive comb-shaped patch member machined with a plurality of comb fingers extending radially along the periphery of the patch member, and a magnetic circuit device rotatably displaceable relative to the patch member. This is configured with a number of sensing coils, each having a distinct directional sensing preference designated by a normal direction of the coil winding, and angularly spaced apart one from another. The directional sensing feature of the magnetostrictive phased array sensor (MPAS) is based on the combined effect of the magnetic anisotropy of the comb finger formation of the comb-shaped patch member and the sensing directionality of each coil sensor in the magnetic circuit device.

The present invention is also directed to a magnetostrictive phased array sensor (MPAS) using a compact (smaller than 1 inch in diameter) comb-shaped magnetostrictive patch member and a rotationally displaceable magnetic circuit device detachably fixed to the comb-shaped patch member and controllably rotating about the vertical axis of the MPAS to acquire additional GLW signal data from various sensing sections within the comb-shaped patch member (in addition to the directions assumed by the coil sensors included in the magnetic circuit device) by controllably altering the rotational orientation of the magnetic circuit device relative to the comb-shaped patch member, such that signal data additions attain a higher resolution damage detection for the advanced phase array signal processing technique.

BACKGROUND OF THE INVENTION

Piezoelectric transducers are most commonly used for the ultrasonic guided wave (GW)-based techniques for monitoring structural health due to their high sensitivity, cost-effectiveness, and simple operational principles. The direct and inverse piezoelectric effects of the piezoelectric transducers generating and acquiring the GWs in structures under inspection.

Similar to the piezoelectric transducers, magnetostrictive patch transducers (MPTs) or magnetostrictive sensors (MsSs) have been widely employed for the GW interrogation approach in cables, pipes, and plates (for example, described in H. Kwun, et al., "Magnetostrictive sensor technology and its applications," Ultrasonics 36(1-5), 171-178 (1998); and Y. Y. Kim, et al., "Review of magnetostrictive patch transducers and applications in ultrasonic nondestructive testing of waveguides," Ultrasonics 62, 3-19, 2015).

Magnetostrictive transducers operate in accordance with magnetostrictive principles and have been used in generating and measuring ultrasonic waves at frequencies ranging between approximately 20 kHz and 1-2 MHz for nondestructive evaluation of waveguides such as pipes and rods, as well as plates. Magnetostrictive transducers (or sensors) are capable of generating and detecting guided waves electromagnetically in a material under inspection. Guided waves refer to mechanical (or electric) waves in ultrasonic and sonic frequencies, propagate in a waveguide medium, such as pipes, rods, plates, etc., parallel to the plane of their boundary guided by the geometric boundaries of the medium.

The magnetostrictive transducers rely for wave generation on the magnetostrictive (Joule) effect that refers to a small change in the physical dimensions or shape of ferromagnetic materials caused by an externally applied magnetic field. For wave detection, the magneto strictive transducers rely on the inverse-magnetostrictive (Villari) effect that refers to a change in the magnetic induction of ferromagnetic material caused by mechanical stress (or strain).

Presented in Y. Y. Kim, et al., "Review of Magnetostrictive Patch Transducers and Applications in Ultrasonic Non-Destructive Testing of Waveguides", Ultrasonics, 62(2015), 3-19, are magnetostrictive patch-based transducers that exploit the magnetostrictive phenomena between mechanical and magnetic fields in ferromagnetic materials. The described magnetostrictive patch transducers (MPTs) use a magnetic circuit composed of permanent magnets and coils, and a thin magnetostrictive patch that works as a sensing and actuating element which is bonded onto or coupled with a test waveguide. The configurations of the circuit and magnetostrictive patch critically affect the performance of the MPT as well as the excited and measured wave modes in a waveguide.

The magnetostrictive patch transducer (MPT), shown in FIG. 1A, includes a circular disc-shaped patch (MS patch) and eight coils disposed in a single plane on the MS patch. The planar solenoid array shown in FIG. 1A is used for dynamic magnetic field generation. The planar solenoid array used in the MPTs for transduction of Lamb waves and/or shear-horizontal (SH)-guided waves in plates under test.

Another type of the magnetostrictive patch-based transducer (MPT) presented in Y. Y. Kim, et al., is shown in FIG. 1B. This MPT uses a magnetostrictive patch of annular shape with a permanent magnet extending centrally of the magnetostrictive patch and a coil wound on the top of the magnetostrictive patch. This is a plate-specific MPT capable of omni-directional functionality, i.e., to generate omni-directional Lamb waves and omni-directional SH waves. The magnet and the coil solenoid (planar solenoid coil)

produce radially-flowing static and dynamic magnetic fields in the circular patch, respectively.

Another omni-directional MPT, shown in FIG. 1C, was presented in the Y. Y. Kim, et al. publication for generating omni-directional SH-waves consists of an annular magnetostrictive patch, a cylindrical permanent magnet, and a coil positioned over the patch that is specifically wound in the form of a toroidal coil. The magnet supplies the radial bias magnetic field and the circumferential dynamic magnetic field of the coil to the patch.

In order to transmit guided waves in a plate mainly along a target direction, the MPT arranged in a planar solenoid array, as shown in FIG. 1A, can be used. In this MPT, an angle between the direction of the bias magnetic field of two magnets in the direction of the dynamic field of the eight coil planar solenoid array can be adjusted. This angle affects the type and magnitude of generated wave modes, and in turn, the radiation patterns of a directional MPT.

The directionality of the planar solenoid array-based MPT is based on changing the relative displacement of the plane solenoid array with regard to the patch. However, without rotating the device, this arrangement is not considered a directionally sensitive device due to the fact that all coils in the planar solenoid array are positioned in the planar configuration in parallel relationship one with another along the same direction. Another shortcoming of the prior art device is that for measurements, generally a large number of transducers are to be used.

To use various GW methods for inspecting plates and pipes, distinct magnetostrictive transducers with specially configured sensing coils and biasing magnets have been developed.

Pure nickel, iron-cobalt alloy, and iron-gallium alloy (Galfenol) are magnetostrictive materials frequently used to manufacture MPTs, which are firmly bonded to (or embedded in) a waveguide structure for the GW testing.

For example, as presented in B. Yoo, et al., "Directional magnetostrictive patch transducer based on Galfenol's anisotropic magnetostriction feature," Smart Mater. Struct. 23(9), 095035 (2014), a highly textured iron-gallium alloy (Galfenol) patch behaving like a single-crystal Galfenol can be employed to develop an advanced MPT with a directional sensing capability based on the <100> texture orientation of the Galfenol patch.

In addition, various magnetostrictive patches have been investigated to develop the directional MPT for the guided Lamb wave (GLW) technique. The advantages, such as sensing performance improvement and directional sensing aspect in the use of comb-shaped nickel patches, were theoretically estimated and the associated experiments verified the findings, as presented in B. Yoo, et al., "Magnetic shape anisotropy effect on sensing performance and directional sensitivity in magnetostrictive nickel patch transducer," J. Intell. Mater. Syst. Struct. 27(8), 1075 (2016).

An MPT (J. K. Lee, et al., "Omnidirectional Lamb waves by axisymmetrically-configured magnetostrictive patch transducer," IEEE Trans. Ultrason., Ferroelec., Freq. Control 60, 1928, 2013) uses a disc ring type sensing coil. This MPT can be used for the omnidirectional study since it has no directional sensing preference due to its design concept.

Anisotropic MPTs with the highly textured Galfenol or the linear comb-shaped nickel patch have been studied. They exhibited unique directional sensing features for capturing GLWs in aluminum plates. For the cases of the nickel comb patches, the magnetic shape anisotropy of the high-aspect-ratio comb finger formation on the nickel patch induced the directional sensitivity and sensing performance enhancement of the corresponding MPT, since the demagnetization factor dramatically decreases as the aspect ratio of the nickel patch increases (A Aharoni, "Demagnetizing factors for rectangular ferromagnetic prisms," J. Appl. Phys. 83, 3432 (1998).

Kim, et al., in "Effects of slits in a patch of omnidirectional Lamb-wave MPT on the transducer output," Smart Mater. Struct. 25(3), 035019 (2016), investigated the effects of the presence of radial slits (machined gaps) in a nickel disc patch used for an omnidirectional MPT. It was confirmed that the radial slits formed on the nickel patch substantially contributed to the increase of the dynamic magnetic field in the patch of the omnidirectional MPT, resulting in the increase in the overall transducer output power.

Phased sensor array systems have been developed using thin magnetostrictive strips/patches for the GW testing of pipes (H. W. Kim, et al., "Circumferential phased array of shear-horizontal wave magnetostrictive patch transducers for pipe inspection," Ultrasonics, 53(2), 423-431 (2013); and J. L. Rose, et al., "Magnetostrictive sensor array for active or synthetic phased-array focusing of guided waves", U.S. Pat. No. 8,907,665).

The magnetostrictive phased array transducer was attached to a specific external pipe surface along the circumferential direction to generate longitudinal and torsional guided waves which were measured.

For the GLW testing of a plate structure, Lee, et al. (in "Development and application of phased array system for defect imaging in plate-like structures," Trans. of the KSNVE 24, 123-130, 2014) developed a phased array system based on a group of OL-MPTs (Omnidirectional Lamb wave Magnetostrictive Patch Transducer) with a diameter of 20 mm. The OL-MPT array (composed of 4 transmitters and 4 sensors) was attached at fixed locations on a thin aluminum plate for crack detection experiments.

In general, a phased array sensor developed for the GLW technique is based on piezoelectric materials due to their actuation and sensing performance by the piezoelectric effect. Numerous studies have been conducted by using the piezoelectric-based phased array sensor to identify the structural integrity in metallic and composite panel structures. There were no directional preferences in the individual sensing parts of the traditional phased array sensors. The directional sensing aspect of the traditional phased array sensors was based exclusively on using the phased array signal processing algorithms.

Although extensive progress has been attained in the art of magnetostrictive patch transducers (MPTs), it is still desirable to provide compact MPTs attaining high sensing directionality and resolution applicable to structural damage detection and monitoring which are capable of precise directional measurements afforded by the use of a single MPT device.

SUMMARY OF THE INVENTION

It is therefore an object of the present invention to provide a compact magnetostrictive phased array sensor (MPAS) based on a magnetostrictive patch member having improved directional sensitivity, high resolution and capable of precise measurements.

It is another object of the present invention to provide an MPAS utilizing a single magnetostrictive comb-shaped patch with a diameter not exceeding 1" and a magnetic circuit device having a radius not exceeding 0.5" and containing 3, 4 or 6 sensing coils arranged in an angular spaced apart relationship one with respect to another, thus providing a directional sensitivity in various orientational directions.

It is a further object of the present invention to provide an MPAS containing a fixed number (3, 4, 6) of the sensing coils where the number of the sensing positions can be extended by simply altering the rotational position of the magnetic circuit device relative to the magnetostrictive patch.

It is still an object of the present invention to provide an MPAS having a high resolution image of the output signals and improved GLW sensing effect, where the GLW signals acquired by the MPAS are analyzed through application of a wave number filtering technique applied for the output phased array signals acquired for various measurement positions of the magnetic circuit device relative to the magnetostrictive patch.

In one aspect, the present invention is directed to a directional magnetostrictive phased array sensor (MPAS) which includes:

an annularly-contoured comb-shaped patch member formed from a magnetostrictive material and configured with a plurality of comb finger members extending radially at the periphery of the patch member.

The MPAS further includes a magnetic circuit unit removably attached to the patch member along its central axis thereof in an angularly displaceable relationship with the patch member about a rotational axis of said magnetic circuit unit. The rotational axis of magnetic circuit unit coincides with the central axis of the patch member.

The magnetic circuit unit is configured with:
a number of sensing coils (for example, 3, 4, or 6) extending radially along a respective longitudinal axis thereof in a spaced apart angular relationship one with another. Each sensing coil has a respective sensing direction along its respective longitudinal axis. At least two cylindrically-shaped biasing magnets are installed in the magnetic circuit unit along its rotational axis. The biasing magnets generate a static magnetic field in the patch member.

The patch member, being attached to a structure under study, undergoes a deformation caused by guided waves propagating in the structure under study, which results in generation of a strain-induced dynamic magnetic field coupled to the sensing coils. A change detected in the generated dynamic magnetic field measured for at least two sensing positions of the magnetic circuit unit relative to the patch member is representative of the presence of an irregularity in the structure under study.

The subject MPAS further comprises a rotating mechanism operatively coupled to the magnetic circuit unit for controllable rotation of the magnetic circuit unit relative to the patch member.

The rotating mechanism controls the sensing position of the sensing coils relative to the structure under study, thus establishing various directional orientations of a respective sensing coil for measuring the dynamic magnetic field induced in the patch member and coupled to the respective sensing coil in the respective sensing direction. Various directional orientations for measuring the dynamic magnetic field include directions angularly spaced apart an angle smaller than the angular displacement between the sensing coils in the magnetic circuit device.

The rotating mechanism angularly displaces the magnetic circuit unit to measure the dynamic magnetic fields in a number of directions which is at least double the number of the sensing coils in the magnetic circuit device.

The patch member is made from a magnetostrictive material, such as nickel, iron, cobalt, iron-gallium (Galfenol), iron-cobalt, alloys and their combinations.

The patch member is configured with at least 24 comb finger members equidistantly spaced apart along its periphery.

The rotating mechanism preferably includes a ring gear operatively coupled to the magnetic circuit unit, a stepper motor, and a motor gear of the stepper motor engaged with the ring gear. The stepper motor is controllably actuated to control the directional orientation of the magnetic circuit unit.

The guided waves include guided Lamb waves (GLWs) propagating in the structure under study. The GLWs are reflected from an irregularity in the structure under study towards the patch member, thus changing the dynamic magnetic field produced in the patch member due to the magnetostrictive mechanism which indicates the presence and location of the irregularity.

The magnetic circuit unit further includes coil bobbins, each configured with a central portion formed with a passage and two end portions attached to the central portion at its opposing sides. A pair of sensing coils is wound on end portions of each coil bobbin. The coil bobbins (with coils wound thereon) are assembled in a stuck formation with its central passages aligned along the rotational axis of the magnetic circuit unit. The biasing magnets are disposed in the aligned passages of the coil bobbins.

The subject directional MPAS further includes an upper cover and a bottom cover engaged, at the peripheries thereof, and housing the magnetic circuit unit therebetween.

Another aspect of the present invention covers a system for structural health monitoring, using a directional magnetostrictive phased array sensor (MPAS). The MPAS includes an annularly-contoured comb-shaped patch member formed of a magnetostrictive material and configured with a plurality of comb finger members extending radially along the periphery of the patch member. A magnetic circuit unit is removably attached to the patch member along its central axis and angularly displaceable relative thereto about a rotational axis of the magnetic circuit unit. The rotational axis of the magnetic circuit unit coincides with the central axis of the patch member.

The magnetic circuit unit is configured with a plurality of sensing coils extending radially along a respective longitudinal axis thereof in spaced apart angular relationship one with another in the magnetic circuit unit. Each sensing coil has a sensing direction coinciding with its longitudinal axis.

At least a pair of biasing cylindrically-shaped magnets are installed in the magnetic circuit unit along its rotational axis. The biasing magnets generate a static biasing magnetic field in the patch member.

The subject system further includes a source of ultrasonic excitation, and a signal data acquisition sub-system operatively coupled to the magnetic circuit unit to obtain generated signals.

For the structural health monitoring procedure, the comb-shaped patch member is attached to a structure under study with the sensing coils oriented subsequently in at least two predetermined angularly spaced apart directions.

The source of ultrasonic excitation is operatively coupled to the structure under study to generate guided Lamb waves (GLWs) propagating in the structure under study. The GLWs cause a deformation of the patch member attached thereto, resulting in generation of a respective strain-induced dynamic magnetic field in the patch member at each of at least two predetermined directions. The generated dynamic magnetic field is coupled to the sensing coils.

The signal data acquisition sub-system measures the strain-induced dynamic magnetic field induced at each of at least two predetermined directions as an output on respective ones of the sensing coils. The presence and direction of an irregularity in the structure under study is determined based on the change of the dynamic magnetic field between at least two directions.

A further aspect of the present invention covers a method for structural health monitoring using a magnetostrictive phased array sensor (MPAS). The subject method comprises the steps of:

establishing an MPAS configured with a circular comb-shaped patch member manufactured from magnetostrictive materials and formed with a plurality of comb fingers extending radially along the periphery of the patch member, and a magnetic circuit unit is attached to the patch member along a central axis thereof and rotationally displaceable relative thereto about a rotational axis of the magnetic circuit unit. The rotational axis of the magnetic circuit unit coincides with the central axis of the patch member.

The magnetic circuit unit is configured with a plurality of sensing coils extending radially in the magnetic circuit unit in a predetermined spaced apart angular relationship one with another. Each of sensing coils has a sensing direction coinciding with its longitudinal axis.

The magnetic circuit unit is further formed with a pair of biasing cylindrically shaped magnets installed along the rotational axis for generating a static biasing magnetic field induced in the sensing coil.

The method continues by coupling a source of ultrasonic excitation to a structure under study, attaching the comb-shaped patch member of the MPAS to the structure under study, and operatively coupling a signal data acquisition sub-system to the magnetic circuit unit.

Subsequently, the magnetic circuit unit is positioned in a first and at least a second measuring direction with the sensing direction of a respective sensing coil in each of the first and second directions angularly displaced one from another.

The subject method continues by:

activating the source of ultrasonic excitation to generate guided Lamb waves (GLWs) propagating in the structure under study, thus causing a deformation in the patch member attached thereto and generating a respective strain-induced dynamic magnetic field on the patch member coupled to the respective sensing coil; and measuring, at each of the first and second measuring directions, the strain-induced dynamic magnetic field coupled to the respective sensing coil.

The presence of an irregularity in the structure under study is determined in the subject method if a difference between the dynamic magnetic fields in the first and second measuring directions has been detected.

These and other objects of the present invention will become apparent after reading further description of the preferred embodiment(s) of the subject invention in conjunction with the accompanying Patent Drawings in the subject Patent Application.

BRIEF DESCRIPTION OF THE DRAWINGS

FIGS. 1A, 1B, and 1C illustrate various types of prior art magnetostrictive patch-based transducers;

FIGS. 2A-2G are representative of structural details of the subject magnetostrictive phased array sensor (with FIG. 2A showing the perspective view of the subject MPAS, FIG. 2B being the exploded view of the subject MPAS, FIG. 2C showing the components of the magnetic circuit device of the MPAS, FIG. 2D further detailing the magnetic circuit device in the subject MPAS, FIG. 2E illustrating the subject MPAS without enclosure components, FIG. 2F showing a top view of the subject MPAS, and FIG. 2G showing a bottom view of the subject MPAS);

FIG. 3A is representative of the prototype of the subject MPAS;

FIG. 3B shows the subject MPAS configuration with six sensing coils in relation to the circular comb-shaped magnetostrictive patch;

FIGS. 4A-4E detail the magnetic circuit unit in the subject MPAS (with FIG. 4A showing six sensing coils wound on three coil bobbins, FIG. 4B showing the details of the sensing coil bobbin, FIG. 4C showing the top view of the sensing coils assembled with the biasing magnets, FIG. 4D showing the bottom view of the sensing coils assembled in the sensor housing, and FIG. 4E showing a bottom view of the bottom cover, and the stepper motor gear coupled to the top cover);

FIGS. 5A-5C are representative of different configurations of the magnetic circuit device in the subject MPAS (with FIG. 5A showing three sensing coils arrangement, FIG. 5B showing four sensing coil arrangement, and FIG. 5C showing six sensing coils);

FIGS. 13A-13C are diagrams representative of differential array images for the Dam1 loosened bolt in the cases of 70 kHz and 80 kHz excitation frequencies (with FIGS. 13A and 13D obtained using PPAs, FIGS. 13B and 13E for the MPAS based on the original six sensing signal data, and FIGS. 13C and 13F obtained from the subject MPAS with twelve sensing signal data from the original and 30° rotated orientations of the magnetic circuit device);

FIG. 18A shows travel paths of guided waves traveling from the wave actuation source and the reflected waves;

FIGS. 18B-18C are phased array images for PZT1 actuation case and PZT2 actuation case, respectively;

FIGS. 19A-19D are phased array images obtained using the disc-shaped patch (FIGS. 19A-19B) vs. images obtained using the subject MPAS (FIGS. 19C-19D), respectively; and FIGS. 20A-20D are phased array images for six sensing positions (FIGS. 20A-20B) and twelve sensing positions (FIGS. 20C-20D) for PZT1 and PZT2 actuators, respectively.

DETAILED DESCRIPTION OF THE PREFERRED EMBODIMENTS

Figures 1A, 1B:
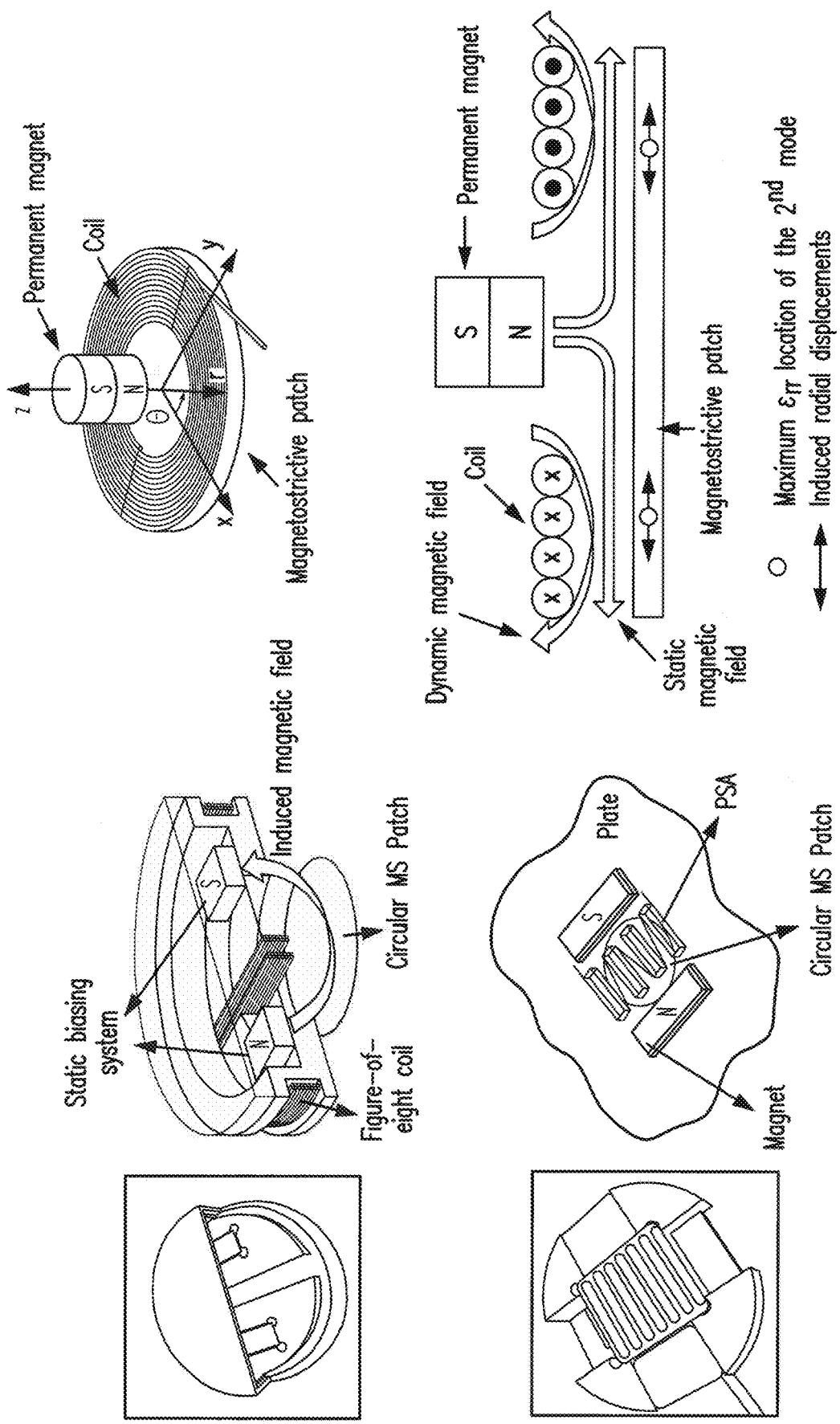

Referring to FIGS. 2A-2G, 3A-3B, 4A-4E, 5A-5C, and 6A-6B, an ultrasonic guided Lamb wave (GLW-based) magnetostrictive phased array sensor (MPAS) 10 uses an annular comb-shaped magnetostrictive patch 12 having approximately 1" in diameter which makes the subject MPAS 10 a highly compact device.

The compact MPAS 10 includes the magnetostrictive patch member 12 and a magnetic circuit device (unit) 14 removably attached to the path member 12 along the central axis 26 of the patch member 12. The magnetic circuit unit 14 is configured to be rotatable about its rotational axis 27 which coincides with the central axis 26 of the patch member 12.

The patch member 12 is a comb-shaped annularly-contoured member which can be machined from a magnetostrictive material with a plurality (for example, 24) of comb-fingers 16 extending in the patch's radial direction and disposed, preferably equidistantly, along its periphery.

The magnetic circuit 14 includes a predetermined number (for example, 3, 4, 6, or more) of sensing coils 18 and cylindrical biasing magnets 20. Each sensing coil 18 has a distinct directional sensing preference designated by the normal direction (along the longitudinal axis) 22 of the coil winding 24.

The directional sensing feature of the subject MPAS 10 is based on and supported by the combined effect of the magnetic shape anisotropy of the comb finger formation in the magnetostrictive patch 12 and the sensing directionality of a sensing array 28 which includes the sensing coils 18.

The MPAS 10 operates by detecting the strain-induced magnetic property change in the magnetostrictive comb-shaped patch 12 due to the mechanical interaction between the magnetostrictive patch 12 and the guided Lamb waves (GLWs) as will be detailed in following paragraphs.

Although the MPAS 10 holds a predetermined number of the physical coil sensors 18 (for example, 3, 4, or 6, or any other number suitable of the measurements), the array sensor 28 allows acquisition of additional GLW signal data from different sensing sections relative to the magnetistrictive patch member 12 simply by altering the rotational orientation of the magnetic circuit device 14 relative to the magnetostrictive patch 12. The additional sensing directions can be angularly spaced apart a smaller angle than the angular displacement between the sensing coils 18 predetermined by the particular design of the magnetic circuit unit 14.

For example, for the six sensing coils arrangement having a 60° angular displacement (by design), the measurements can be taken at displacements smaller than 60° simply by rotating the magnetic circuit unit 14 about its rotational axis 27 any desired angle smaller than 60°, thus creating any number of sensing directions for measuring magnetic properties of the structure under study, and particularly, detecting changes in magnetic properties, along the original and additional sensing directions. Such signal data additions provide a higher resolution in the damage detection methodology for the advanced phased array signal processing technique.

The MPAS system 10 and the structural health monitoring technique based on the subject MPAS 10 have been experimentally validated by GLW inspection testing with a thin aluminum plate installed with numerous joint bolts, as will be detailed infra.

Specifically, returning to FIGS. 2A-2G, the subject MPAS 10 includes the circular comb-shaped patch 12 which may be formed from any magnetostrictive material. A good candidate material for manufacturing the patch member 12 may, for example, be nickel, cobalt, iron, iron-gallium (Galfenol), iron-cobalt, as well as their alloys and combinations. Other magnetostrictive materials are also contemplated for manufacturing the patch 12.

An MPAS has been built with the magnetostrictive patch 12, having for example, the dimensions of Ø1"×0.02". The patch 12 was fabricated from a polycrystalline nickel sheet. In the exemplary embodiment 24 comb fingers 16 were machined in the radial direction of the magnetostrictive path 12. The comb fingers 16 were equidistantly disposed along the periphery of the patch 12. Different numbers of comb fingers are also contemplated for the patch 12.

In the manufactured exemplary device, as presented in FIG. 3A, the angular displacement of the individual comb fingers 16 is approximately 15°. The width and length of each comb finger 16 was about 0.1" and 0.25", respectively.

The circular comb-shaped patch 12 is firmly bonded to a host structure (structure under study) for the GLW measurement technique, as will be presented in the following paragraphs. The magnetic circuit device 14 constitutes a detachable module which can be removably attached to the patch member 12 for the measurement procedure.

As shown in FIGS. 5A-5C, the magnetic circuit unit 14 may include any number of sensing coils 18, such as, for example, 3, 4, 6, or any other number suitable for the measurement process.

However, as an example only, and not to limit the scope of the subject system to any particular implementation, the unit 14 is described herein as containing 6 sensing coils 18 (as shown in FIGS. 2B-2G, 3A-3B, 4A, 4C-4D, and 5C)

arranged in a 1" diameter hexagon shape. The magnetic circuit unit 14 also includes vertically polarized cylindrical permanent magnets 20 positioned at the center of the magnetic circuit device 14 along its rotational axis 27. The rotational axis 27 coincides with the central axis 26 of the patch 12. The individual sensing coils 18 constitute, in combination, the array sensor 28. Each coil 18 has a distinct directional sensing preference specified along the normal direction 22 of the coil winding 24.

Figures 2D, 2E, 2F, 2G:
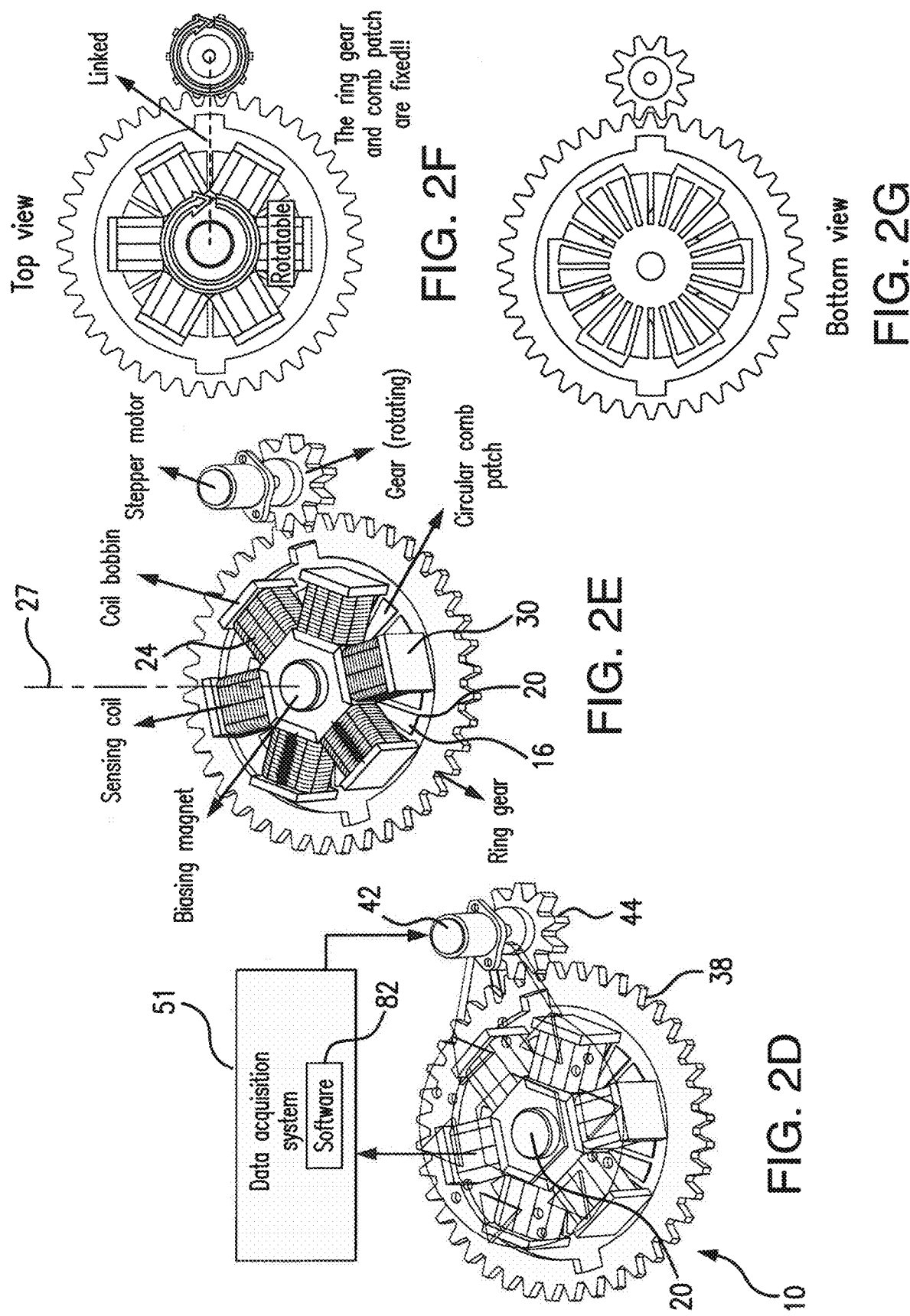

As shown in FIGS. 4A-4D and 5A-5C, the sensing coils 18 are formed with coil windings 24 wound on respective coil bobbins 30. For example, for the exemplary 6 sensing coils arrangement presented in FIGS. 2B-2G, and 4A, 4C-4D, a pair of windings 24 may be wound on the same coil bobbin 30. In this arrangement, as shown in FIGS. 2C and 4A-4B, each coil bobbin 30 has a central portion 32 configured with an opening 34, and a pair of core (end) portions 36. The winding 24 is wound on a respective core portion 36.

Coil bobbins 30 with the coil windings 24 thereon are assembled in a stacked fashion with the openings 34 aligned vertically (as shown in FIGS. 2B, 2D-2G, 3A, 4C-4D, and 5A-5C), and the biasing magnets 20 are installed in the aligned openings 34 of the coil bobbins 30, thus forming the magnetic circuit device 14.

Referring again to FIGS. 2A-2G, and FIG. 6A, the MPAS 10 has a ring gear 38 having gear teeth 40 configured along its periphery. In testing procedures, in order to measure the magnetostrictive property change on the magnetostrictive path 12 induced by the elastic wave propagating, the comb path 12 and the ring gear 38 are coupled to the structure under test. A stepper motor 42 with a pinion gear 44 are installed in the MPAS 10 to automatically alter the rotational orientation of the magnetic circuit device 14 about its rotational axis 27 as needed for the measuring procedure.

In order to multiply the number of the MPAS's sensing directions, and thus increasing the sensing data acquired for the sensing directions, the rotating mechanism (ring gear 38, stepper motor 42, pinion gear 44) is controllably actuated to angularly displace the sensing array 28 relative the patch member 12 any desirable angle smaller than original angular distance between the coils 18.

The stepper motor 42 has a shaft 46 which is fixed within an opening 48 of the gear pinion 44. The gear pinion 44 has gear teeth 50 which are engaged with the gear teeth 40 of the ring gear 38.

In operation, the stepper motor controllably rotates the gear pinion 44 (through the shaft 26 extending in the opening 48 of the gear pinion 44). This action results in controllable rotation of the ring gear 38 through operational engagement between the gear teeth 50 and gear teeth 40.

During the measurements, the ring gear 38 along with the gear pinion 44, as well as the circular comb-shaped patch 12, are secured to a structure under study, while the magnetic circuit device 14 is positioned above the patch 12 and can rotate relative to the patch 12 when being actuated by the stepper motor 42 controlled, in its turn, by the signal (data) acquisition system 51 schematically shown in FIGS. 2D, 3A-3B, 7B, and 9A.

The data acquisition system 51 controls the operation of the MPAS system 10 in accordance with software 82, as will be detailed in the following paragraphs.

Referring to FIGS. 2A-2B, and 4E, the magnetic circuit 14 is received in a housing formed by a bottom cover 52 and top cover 54. The bottom and top covers 52, 54 are joined at their respective peripheries to form the enclosure for protection of the magnetic circuit unit 14 from environmental factors. In order to provide the controllable rotation of the magnetic circuit device 14 inside the housing relative to the patch 12, the bottom cover 52 and the top cover 54 are joined together to envelope the magnetic circuit device 14 therebetween, while the top cover 54 is engaged with the ring gear 38 by protuberances 56 (extending external to its outer surface) are fixed within the recesses 58 formed in the ring gear 38.

Figure 7A:
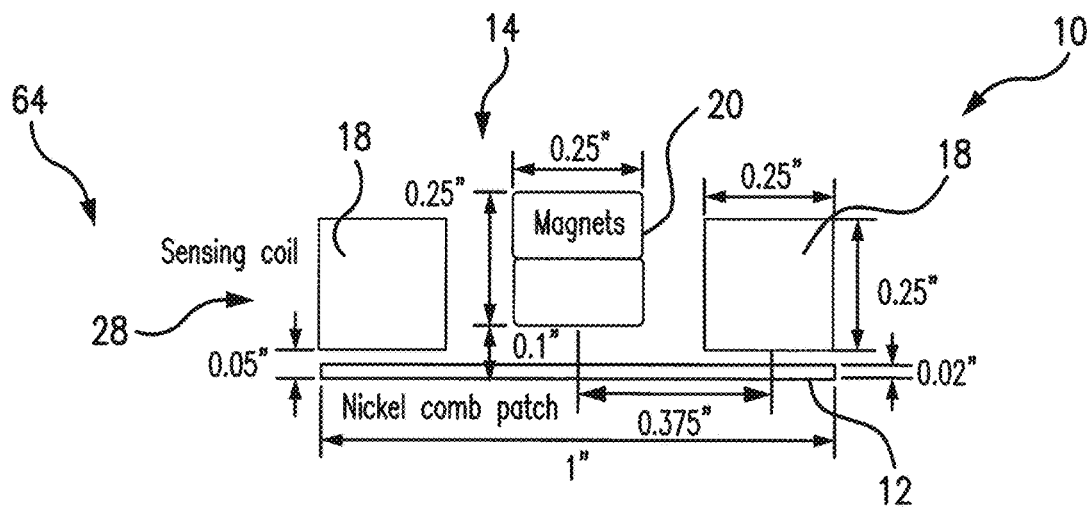
FIGS. 7A and 7B illustrate the system for structural health monitoring using the subject MPAS sensing mechanism prior to and after generation of GLWs, respectively.
Figure 7B:
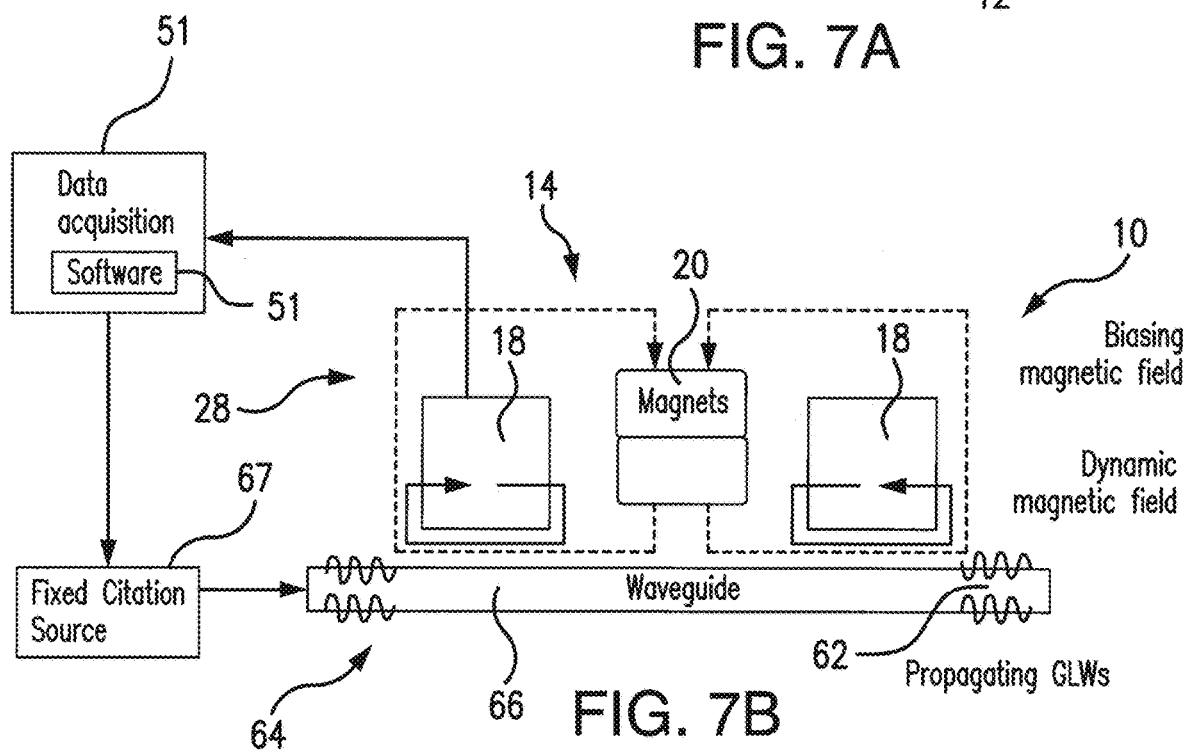

The top cover 54 is configured with a tab 60 to which the stepper motor 42 is attached, as shown in FIGS. 2A-2B, and 2D. Thus, when the stepper motor 42 applies the rotational motion (under control of the software 82) to the gear pinion 44, the ring gear 38 (by gear engagement between its teeth 40 and the teeth 50 of the gear pinion 44) undergoes an angular displacement. The angular displacement of the ring gear 38 causes rotation of the top cover 54, together with the magnetic circuit device 14 (sandwiched in the housing formed by the top and bottom covers) to rotate along with the ring gear 38 to position the MPAS 10 in required sensing orientations for measuring changes in magnetic fields induced in the sensing coils 18 due to the magnetostrictive mechanism provided by the interaction of the magnetostrictive patch 12 with the guided Lamb waves 62 produced in the structure under study 66, as shown in FIGS. 7A-7B, when a source of ultrasonic excitation 67 is coupled thereto.

The top and bottom covers 54, 52, shown in FIGS. 2A-2B, 4E, as well as coil bobbins 30, shown in FIGS. 2B-2G, 4A-4D, 5A-5C, are formed from polymer-based materials and can be printed by using a 3-D printer, for example, a high resolution 3-D printer (Object 500) acquired from Stratasys.

As shown in FIGS. 3A-3B, as well as 4A-4D, and 5C, in the exemplary implementation of the MPAS 10, the magnet circuit device 14 integrates six sensing coils 18 fabricated using 3-D printed non-ferromagnetic coil bobbins 30 wound by 150 turns with 32 AWG magnet wires. FIG. 4B shows the CAD drawing of the sensing coil bobbin 30 with Table 1 showing the sensing coil bobbin parameters of the magnetic circuit unit 14. FIG. 4C is representative of the top view of the sensing array 28 with the coils 18 assembled with the magnets 20, while FIG. 4D is a bottom view of the sensing coil assembled in the top cover 54 of the sensor housing.

TABLE I

Bobbin:
Length: 0.253 inch
Width: 0.184 inch
Height: 0.15 inch
Coil:
32 AWG magnet wire
150 turns
Biasing magnet:
Ø0.25×0.125 inch
A pair of D42-N52 magnets Although the sensing array 28 in the magnetic circuit device 14 includes a fixed number of physical sensing coils 18, the number of the sensing directions in the subject system 10 is expandable by rotating the magnetic circuit device 14 by means of the stepper motor 42 relative to the patch 12. This provides an automated and precise sensor positioning.

As shown in FIGS. 3A-3B, additional sensing positions S1'-S6' for signal data acquisition can be established by using the angular displacement of the S1-S6 sensing coils 18 from their original sensing positions. Thus, the angular displacement between the sensing directions in the subject MPAS 10 may be smaller than the angular displacement between the coils 18 predetermined by the design. For example, for the 6 coils arrangement, the angular displacement therebetween established by the design is 60°. However, by rotating the magnetic circuit unit 14, for example, 30° from the original sensing direction of the sensing coils 18, the angular displacement between sensing directions provided in the subject system can be 30° (instead of 60°). This arrangement thus provides 12 sensing directions in the design having 6 sensing coils 18, i.e., $S_1$-$S_6$ plus $S_1'$-$S_6'$ directions, instead of the original six sensing directions provided by the original sensing directions of six sensing coils 18.

The number of sensing directions can be further increased, if required, by the magnetic circuit device controllably undergoing angular displacements less than 30°.

Thus, by altering the rotational orientation of the magnetic circuit device 14, additional directions of signal data acquisition can be obtained. For example, for the case of six sensing coils 18, twelve (or more) directional sensor configurations can be obtained as shown in FIG. 3A.

Figures 6A, 6B:
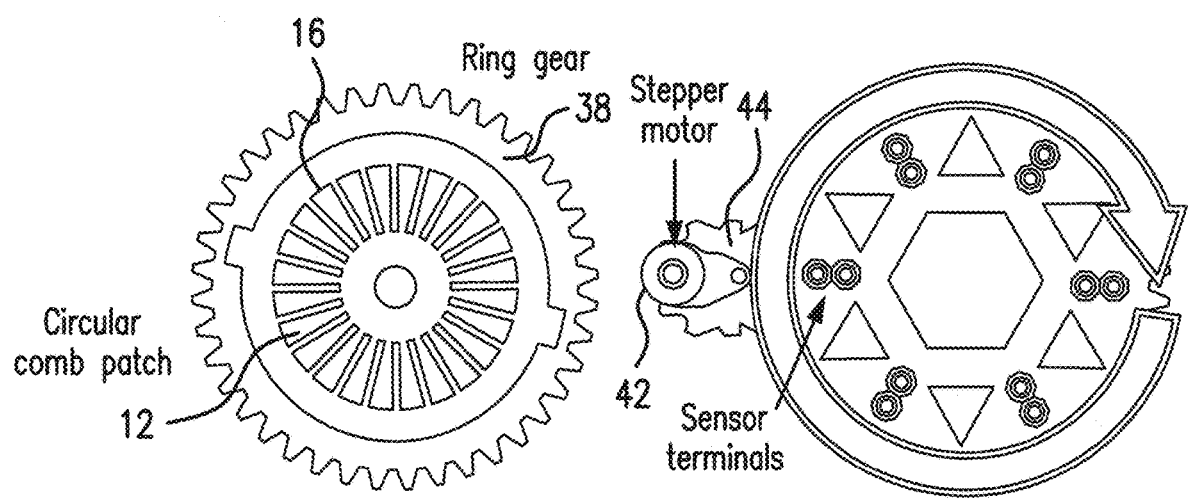
FIG. 6A shows a ring gear and circular comb-shaped magnetostrictive patch for permanent bonding onto a test plate.
FIG. 6B shows the magnetic circuit device attached to the magnetostrictive patch and sensor terminals of the sensing coils.

As shown in FIGS. 6A-6B and 7A-7B, during the measurement procedure, the ring gear 38 and the circular comb-shaped magnetostrictive patch 12 are permanently bonded onto a test plate (as shown in FIGS. 6A and 7A-7B) with the magnetic circuit device 14 removably attached to the magnetostrictive patch 12 by magnetic force of the biasing magnets 20, as presented in FIGS. 6B, and 7A-7B.

For the exemplary prototype device, a 99.5% nickel sheet with a thickness of 0.02" (44823 Nickel foil from Alfa Aesar) was used to fabricate the circular comb patch 12. The comb fingers 16 were machined by using a slow speed diamond saw. The nickel comb patch 12 was bonded with M-Bond 200 kit onto the top surface of a 2024-T3 aluminum plate (24"×24"×0.04") under test.

The ring gear 38 and pinion gear 44, coil bobbins 30, as well as the top cover 54 and bottom cover 52 of the magnetic circuit device 14 were constructed by using an Eden 350 3D printer from Stratasys, Ltd. As shown in FIG. 4E, the bottom cover 52 is used to protect sensing coils from the environmental factors.

The ring gear 38 was bonded at the concentric location of the comb patch 12. The sensing coils 18 were wound on the printed coil bobbins 30 by 150 turns with the 32 AWG (American Wire Gauge) magnet wires.

Two sets of the cylindrical neodymium magnets with dimensions of Ø0.25"×0.125" (D42-N52 from K&J Magnetics, Inc.) were used as the biasing magnets 20 and placed at the center of the magnetic circuit device 14, specifically, in the vertically aligned openings 34 formed in the center of the coil bobbins 30.

The lift-off gap between the sensing coil 18 and the surface-bonded nickel comb patch 12 was set to approximately 0.05" (as shown in FIG. 7A) maintained by the 3D printed parts (such as the bottom and top covers 52, 54).

The micro stepper motor 42 was mounted to the 3D printed top cover 54 used for enclosing the hexagon sensing coils 18 accompanied by the biasing magnets 20. The stepper motor 42 with the pinion 44 was used to change the azimuthal orientation of the magnetic circuit device 14, for acquiring a baseline (no damage) and additional signal data from the different sensing sections of the comb patch 12.

As shown in FIGS. 7A-7B, the subject system 64 for structural health monitoring (SHM) is based on the subject MPAS 10. The SHM system 64 also uses electromagnetic-acoustic transducers (EMATs) or PZTs (referred to herein as an excitation source) 67 to generate Lamb waves (GLW) 62 in the waveguide (structure under study) 66. In operation, the MPAS 10 is coupled to the structure under study 66 with the patch 12 attached thereto.

The GLWs 62 vibrate atoms within the material (structure, plate) under study 66. The elastic waves (GLW) propagation created by the excitation source 67 of GLW (EMATs on PZT), results in magnetostrictive mechanism which deforms the patch 12 (changing its dimension and/or configuration).

The biasing magnets 20 (which are located at the center of the magnetic circuit device 14) generate the static biasing magnetic fields along the radial direction of the ferromagnetic comb patch 12. Responsive to deformation of the patch 12, the GLWs 62 propagating in the waveguide material under study 66 induce dynamic magnetic fields in the patch 12 (attached to the structure under study 66) that are coupled to and subsequently produce alternating currents in the sensing coils 18. The individual sensing coils 18 of the MPAS 10 detect the rate of change of magnetic property at the given positions due to the deformed state of the comb patch 12 induced by the elastic wave stimulation.

In operation, the sensor array 28 is positioned in a predetermined sensing directional orientation relative to the patch member 12. Initially, the baseline (no damage) signal data is obtained. Subsequently, the orientation of the magnetic circuit device 14 is changed during measurement procedure to obtain signals (outputs of the sensing coils) corresponding to the induced dynamic magnetic fields in various sensing directional orientations, as required by and suitable for measurements in order to detect a change in the induced dynamic magnetic field between the sensing directions (relative to the baseline signal data) which may be due to presence of irregularities in the structure 66.

A detailed description of the sensing mechanism of the magnetostrictive patch sensor 10 can be found in the previous publication of the inventors of the subject system (B. Yoo, et al., "Directional magnetostrictive patch transducer based on Galfenol's anisotropic magnetostriction feature," Smart Mater. Struct. 23(9), 095035 (2014).

The data acquisition system 51 is operatively coupled to the sensor array 28 in the magnetic circuit unit 14, and acquires signals output by the sensing coils 18 which correspond to the induced dynamic magnetic fields due to the magnetostrictive mechanism.

Absence of change of the dynamic magnetic field measured in various (for example, at least two) sensing directions, indicates that no irregularity in the structure under study in these directions is found. However, a detected change of the magnetic property (discrepancy between the measure of the induced dynamic magnetic field in different sensing directions), may be considered as an indication of the presence of an irregularity in the structure under study. The change of the magnetic property due to the defect in the structure under study is due to reflection of the propagating GLWs from the boundaries of the defect towards the patch 12, which causes a corresponding magnetostrictive response in the patch member 12, and results in a change in the induced dynamic magnetic field.

Figure 8:
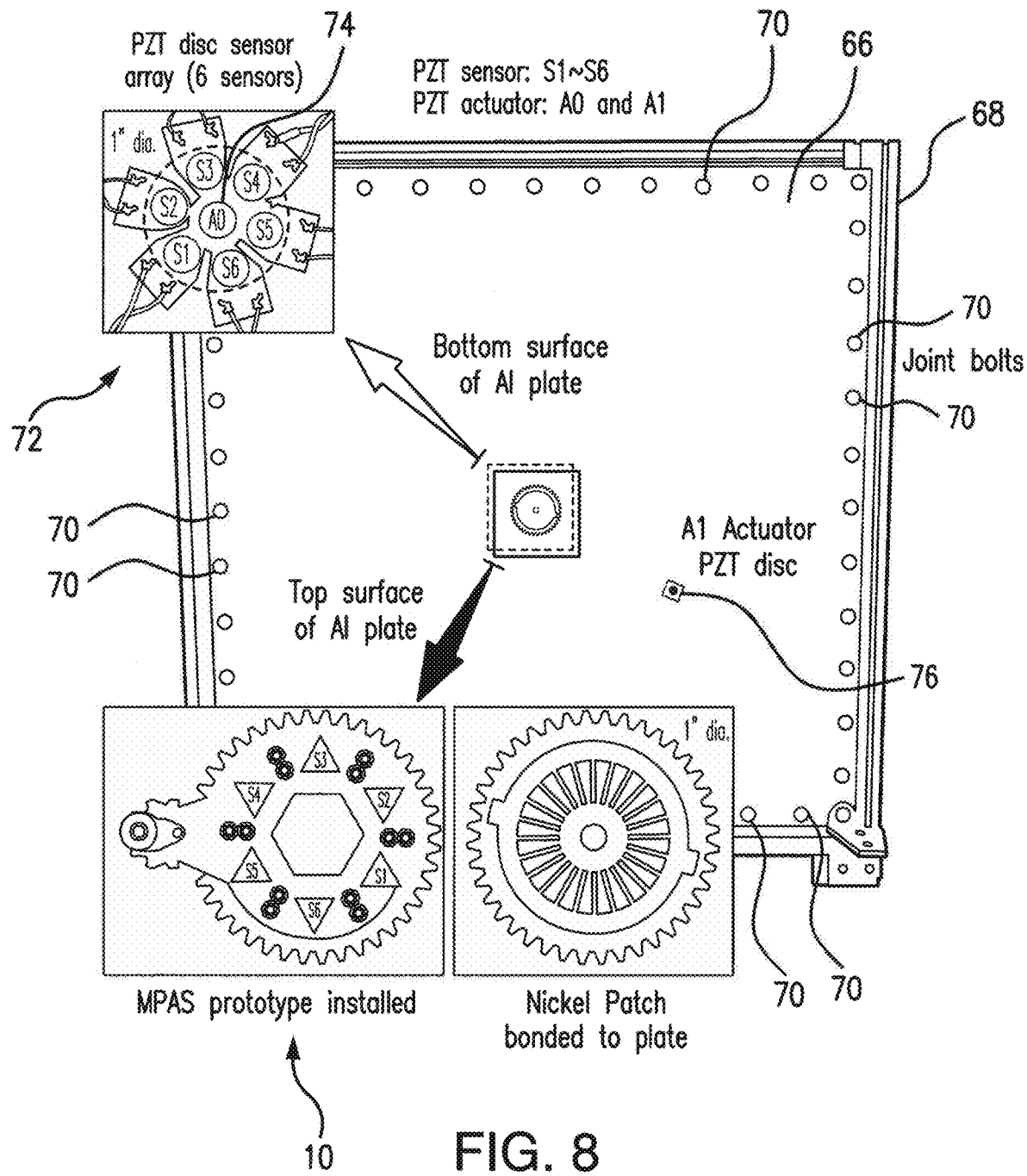
FIG. 8 shows the experimental set up using the subject MPAs for aluminum plate's structural health study.

Although the magnetic circuit device 14 comprises only 6 sensing coils ($S_1$—$S_6$), the sensing data may be also acquired from additional sensing directions by altering the orientation of the magnetic circuit device 14. For example, as shown in FIGS. 3A-3B, the total sensing data of the MPAS can be doubled (or even a larger number of sensing orientations can be obtained) with the same device ($S_1$-$S_6$ plus $S_1'$-$S_6'$), if the sensing coils' orientations are changed with a 30° (or other angular displacements) angular direction displacement relative to the original sensing orientation in a clockwise or a counter clockwise manner Experimental Setups for Structural Damage Detection As shown in FIG. 8, the testing plate (structure under study) 66 was mounted to a framed structure 68 with numerous joint bolts 70. A piezoelectric phased array sensor (PPAS) 72 using 6 PZT discs (each having a diameter of 0.25") arranged within an array having a diameter of 1", was attached at the center of the bottom surface of the plate 66. The individual PZT sensors of the PPAS 72 are denoted as S1-S6 in FIG. 8.

Two additional PZT discs 74, 76 were bonded to the plate 66 to be used as actuators to generate the GLWs in the framed plate 66. One PZT actuator (E0), i.e., the PZT 74, was attached at the center of the PPAS 72. The other PZT actuator (E1), i.e., the PZT 76, was bonded at the distance of 6" along the 330° direction. The E1 PZT actuator 76 was used to verify the phased array signal processing technique, while the E0 PZT actuator 74 was used for the damage detection demonstration.

Figure 9:
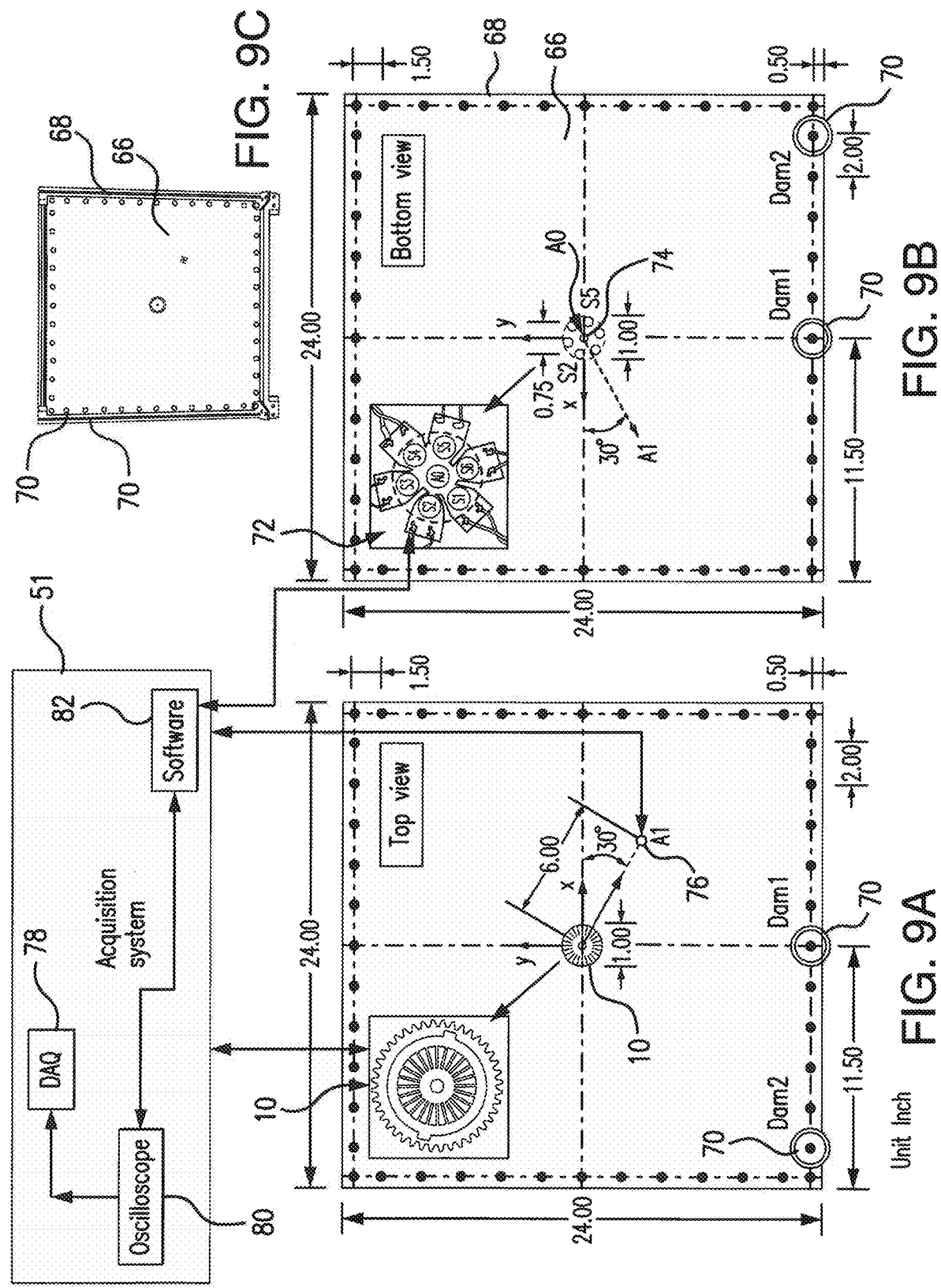
FIGS. 9A and 9B are representative of the top and bottom views of the test plate under study, respectively, and two loosened bolts locations (denoted as Dam1 and Dam2), respectively.
FIG. 9C shows the test plate attached to a frame by bolts.

The detailed information of the experimental setup of FIG. 8 is presented in FIGS. 9A-9C. Two joint bolts 70 (i.e., Dam1 and Dam2) located along 225° and 270° directions were chosen to simulate the structural damage. The individual joint bolts Dam1 and Dam2 were fully loosened for two damage cases shown in FIGS. 9A-9B. FIG. 9C illustrates the experimental setup with the plate 66 attached to the frame 68 with the joint bolts 70.

The Acquisition System 51 shown in FIG. 9A, encompasses the National Instrument (NI) DAQ system 78 with the NI USB-6259 and the LabVIEW software 82. The acquisition system 51 was employed to generate a toneburst signal and acquire the structural response signals obtained from the MPAS 10 and PPAS 72 and displayed on an oscilloscope 80.

A 4.5-cycle Hanning windowed toneburst at a given excitation frequency was generated and linearly amplified to ±80 V by an EPA-104 linear amplifier (Piezo System, Inc.) which is not shown in the Drawings. The amplified toneburst signals were then sent to a PZT actuator 74, 76 to generate GLWs in the plate structure 66. The GLW signals captured by the MPAS 10 and PPAS 72 were amplified by a 40 dB preamplifier (not shown in the Drawings) prior to storing in the NI DAQ system 78.

Two ultrasonic excitation frequency cases (70 kHz and 80 kHz) were examined for the loosened bolts 70 damage detection by both MPAS 10 and PPAS 72. The excitation frequency range was experimentally selected to acquire relatively large A0 mode signals (the fundamental anti-symmetric mode) of the multimodal GLWs. However, there still was another fundamental symmetric (S0) mode signal and mode-converted signals in the received GLW signal data.

For the case of the MPAS apparatus 10, the GLWs generated by the piezoelectric effect of the PZT actuators 74, 76 were captured by the magnetostriction effect of the MPAS 10 by the induced strain related to the GLW propagation over the magnetostrictive comb patch 12.

Figure 10:
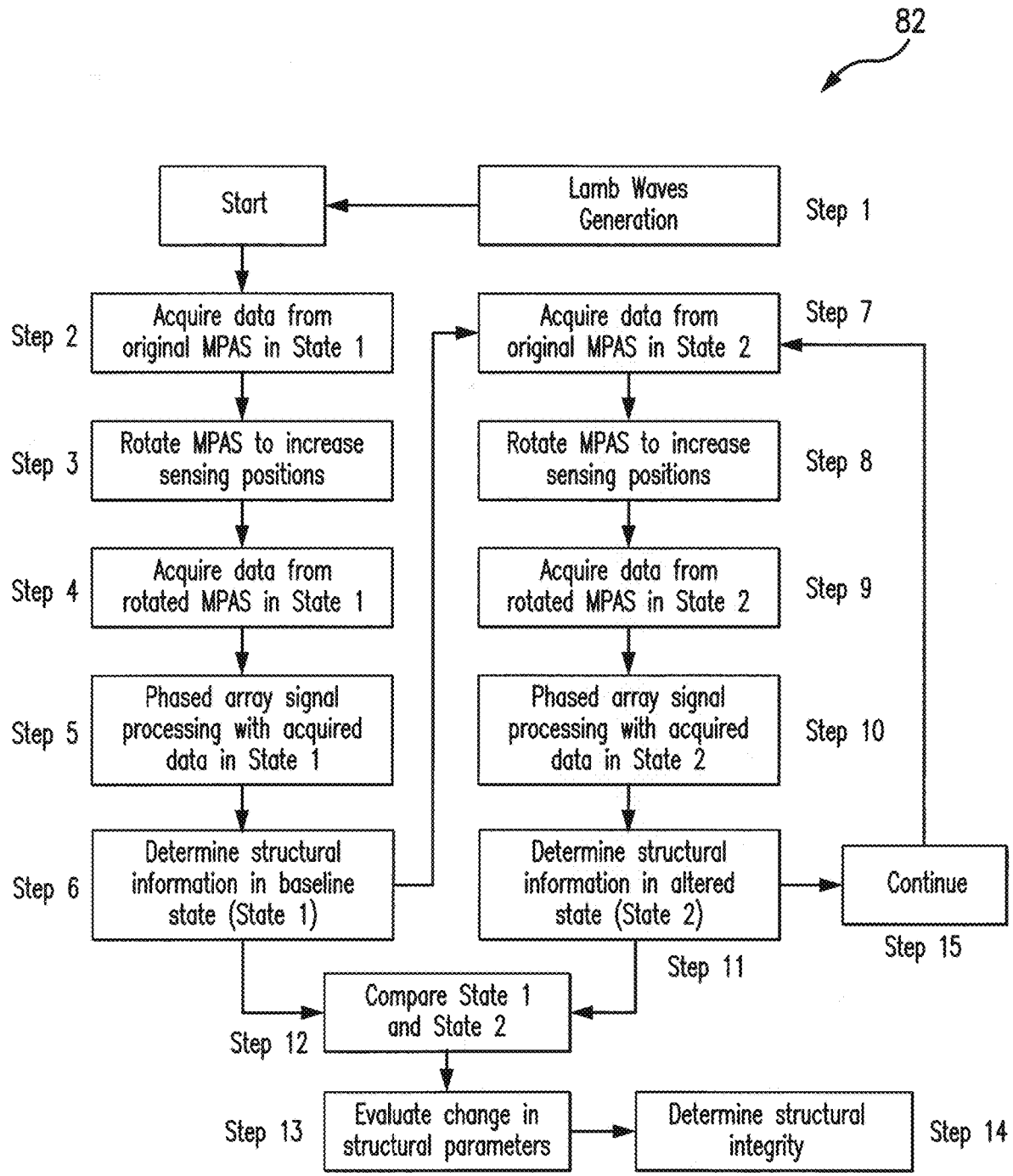
FIG. 10 is the flow diagram of the guided wave-based structural health monitoring method using the subject MPAS.

Shown in FIG. 10 is a flow chart diagram of the subject guided wave-based SHM (Structural Health Monitoring) method performed in the subject SHM system 64. In order to use the subject system to monitor a structural health of the test plate 66, the MPAS 10 is attached to the test plate 66, and is also coupled to the data acquisition system 51 (including the oscilloscope 80) for acquiring and displaying output signals. The output signals represent signals generated by the MPAS 10 due to the magnetostriction mechanism responsive to the Lamb wave's actuation by an actuator PZT operatively coupled to the waveguide (the plate under test) 66. The data acquired and displayed at the oscilloscope 80 subsequently were provided to the DAQ system 78 for storing, processing, and further analysis. The LABview software 82 supports the operation of the measuring system 64 for the structural health monitoring method as presented in FIG. 10.

The operation of the subject system begins in Step 1 by generating Lamb waves through the structural material, for example, either by electromagnetic-acoustic transducers or PZTs operatively coupled to the plate 66 under study.

When the Lamb waves are generated, the procedure starts by initiating Step 2 to acquire data from the original position of the MPAS 10 in State 1. State 1 is a baseline stage (no damage) of the structure 66 under inspection. In Step 2, the MPAS is positioned in a predetermined original sensing orientation.

Upon acquiring data from State 1, the logic flows to Step 3 and controls the stepper motor to rotate the MPAS (specifically the magnetic circuit device 14) to an alternative position (for example, 30° displacement relative to the first predetermined position) to increase sensing directional options.

Subsequently, in Step 4, the data is acquired from the rotated MPAS in State 1, and the phased array signal processing is performed in Step 5 with the acquired data in State 1 from the original and alternative sensing orientations.

Upon completion of the processing in Step 5, the logic passes to Step 6 where it determines structural information in baseline state (State 1).

From Step 6, the logic flows to Step 7, where the data is acquired from the MPAS 10 in its original position in State 2 (which is the altered stage different than the baseline stage, State 2 may correspond to irregularity in the structure under study). In the following Step 8, the logic rotates the magnetic circuit device 14 relative to the original position thereof to increase the number of additional sensing positions.

Upon completion of the routine in Step 8, the data is acquired from rotated MPAS (alternative position) in Step 9. In the subsequent step 10, the logic performs the phased array signal processing with acquired data in State 2.

Subsequently, logic passes to Step 11 where the structural information pertinent to State 2 is determined.

The logic further flows to Step 12 where the structural information and the baseline state (State 1) and in the altered State (State 2) are compared, and change in structural parameters is evaluated in Step 13. Based upon evaluation in Step 13, the logic determines structural integrity in Step 14.

From Step 11, the logic loops to Step 7 to continue the process in Step 15.

Phased Array Signal Processing

The wavenumber filtering algorithm was developed to evaluate a collection of the phased array sensor signals. The wavenumber filtering is similar to the delay-and-sum method in which individual sensor signals are gathered and added together with appropriate amounts of time delays based on the estimates of signal travel time from one sensor to the next. The wavenumber filtering method is, however, based on knowledge of the wavenumber-frequency relationship and may be performed by applying selective spatial weights to each sensor signal.

The phased array signal processing methods are designed to remove unwanted information, such as noises and interferences while enhancing the desired signal component in different directions. A generic expression of the array response for a 2D phased array can be expressed as $$\psi(t,\theta)=\iint\phi(x,y,\theta)v(x,y,t)dxdy \qquad (Eq.\ 1)$$

where $\phi(x,y,\theta)$ is the spatial weight and $v(x,y,t)$ is the signal data obtained from the sensor at the (x,y) location.

The spatial weight corresponding to an ideal filter is given by $$\phi(x,y,\theta)=e^{i[(\bar{k}\cos\theta)x+(\bar{k}\sin\theta)y]} \qquad (Eq.\ 2)$$

where $\bar{k}$ is the desired wavenumber for the wavenumber filtering method and $\theta$ is the angular direction ($0 \le \theta < 360$).

MATLAB software was utilized to implement the wavenumber filtering algorithm for the GLW signal data obtained from the MPAS and PPAS.

Validation of Phased Array Signal Processing

Figures 11A, 11B, 11C:
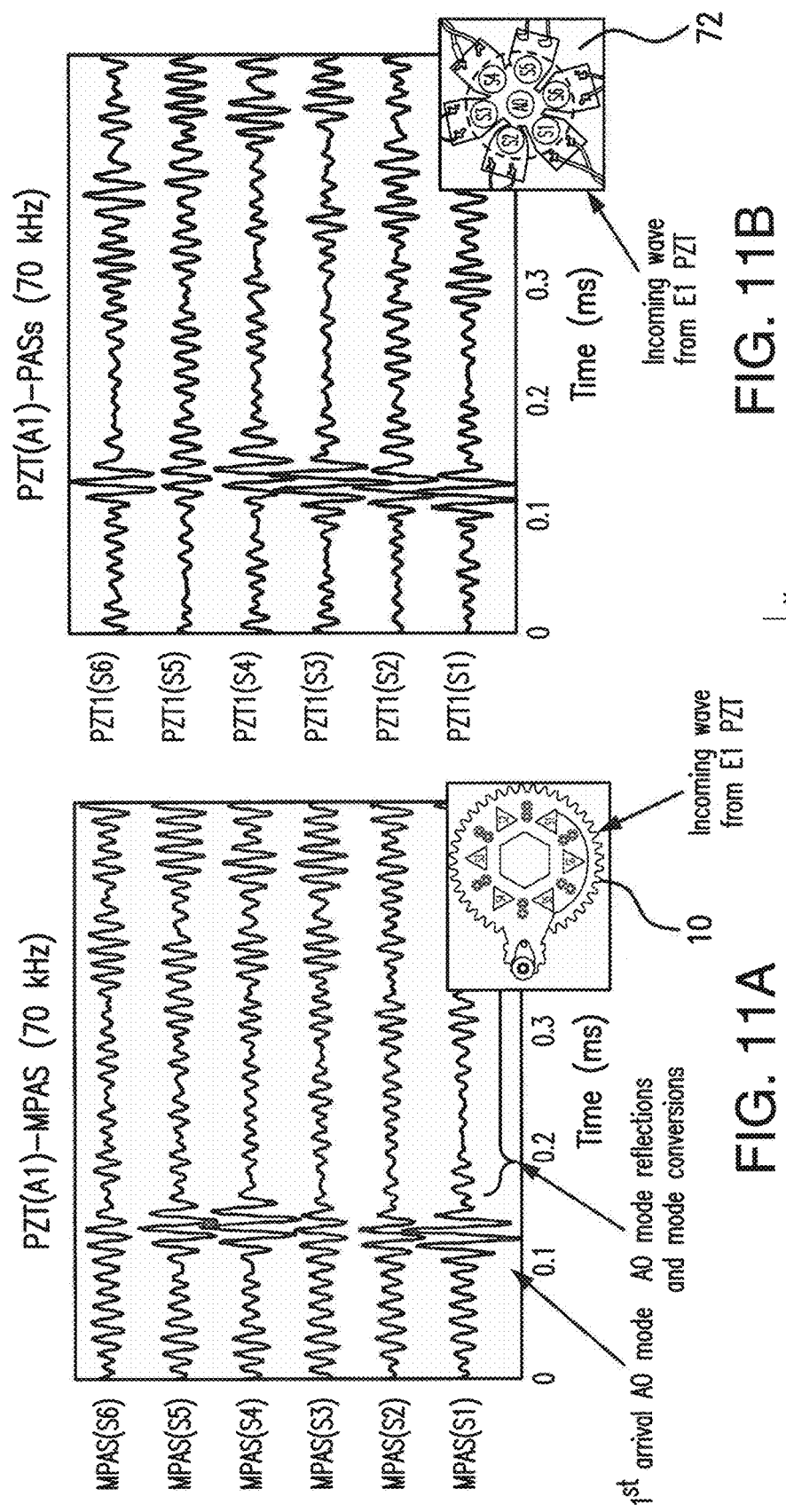
FIGS. 11A and 11B are diagrams representative of the baseline GLW signal data obtained with the individual six sensing coils of the subject MPAS (FIG. 11A) and with the PPAS (FIG. 11B) for the case of E1 PZT actuation with a tone burst signal at 70 kHz excitation frequency.
FIG. 11C details the dimensional and directional characteristics of the PZTs used in the experiment.

The GLW signals were successfully acquired by using both of the MPAS 10 and PPAS 72 at the 70 kHz toneburst actuation with the E1 PZT disc, as shown in FIGS. 9A-9B. The GLW signals from the MPAS 10 were low-pass filtered with a cutoff frequency of 350 kHz by the MATLAB built-in functions such as butter( ) and filtfilt( ) to improve the Signal-to-Noise Ratio (SNR). The incident A0 mode waveforms directly incoming from the E1 PZT actuator are highlighted in FIGS. 11A-11B. FIG. 11C represents the dimensional and orientational details of the PZTs ($A_1$ and $A_0$) included in the measurement scheme.

For the excitation frequency range of 60-100 kHz, the S0 and A0 mode GLWs were presented for the aluminum plate under study. The $A_0$ mode wave was observed to be dominant. The $A_0$ mode arrival in the received signal can be identified based on the theoretical GLW propagation speed in the plate under study and the given wave travel distance which was 6" apart from the center of the individual array sensors to that of the E1 PZT actuator.

The waveform prior to the incident A0 mode waveform is the S0 mode wave and its reflections from the plate boundaries. The other waveforms after the A0 mode arrival are the boundary reflections of the S0 and A0 modes, their mode conversions, and the associated suppositions. FIG. 11A illustrates that the amplitude of the incident A0 mode wave varies by the MPAS's individual sensing coils (S1~S6). The distinct directionality of each sensing coil affected amplitude variations on the GLW signals. The characteristics of the MPAS 10 were based on the orientation of the magnetic circuit unit 14 and the nickel comb fingers 16 with respect to the incoming direction of the GLWs generated from the E1 PZT actuator.

For instance, the S1 and S4 sensing coils showed much bigger amplitudes than other sensing coils because they were fairly aligned to the GLW propagation direction. In FIG. 11B, on the other hand, it is observed that there are amplitude variations for some PZT sensors of the PPAS. Due to the omnidirectional sensing characteristics of the PZT discs, the amplitude variations of the received GLW signals ideally should be insignificant for the adjacent PZT sensors positioned within the area having 1" in diameter.

Although the S3 and S5 PZT sensors are mounted at the mirrored locations regarding the E1 PZT actuator position, the amplitudes of the incident A0 modes obtained from two PZT sensors show a significant difference. The possible and common issue of the PZT sensor installation is the uneven bonding condition, which may cause the GLW sensing performance inconsistency as shown in FIG. 11B.

Figure 12A:
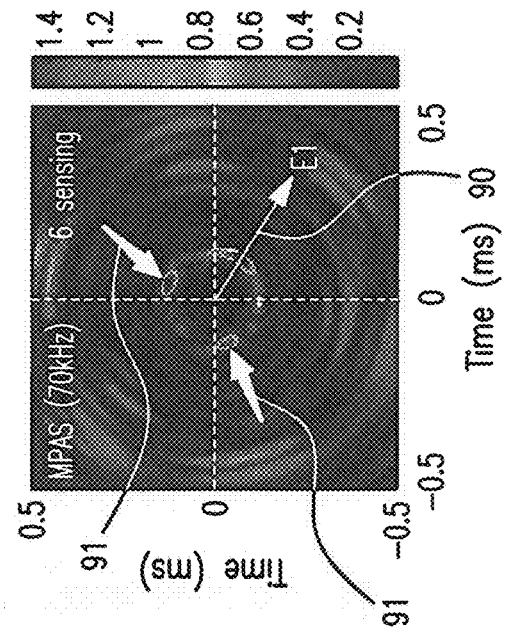
FIGS. 12A-12C are diagrams representative of the array images evaluated by using the 70 kHz baseline GLW signal data obtained from the PZTs (FIG. 12A), subject MPAS based on the original six sensing signal data (FIG. 12B), and the subject MPAS with twelve sensing signal data for the cases of the original 30° rotated orientations (FIG. 12C)
Figure 12B:
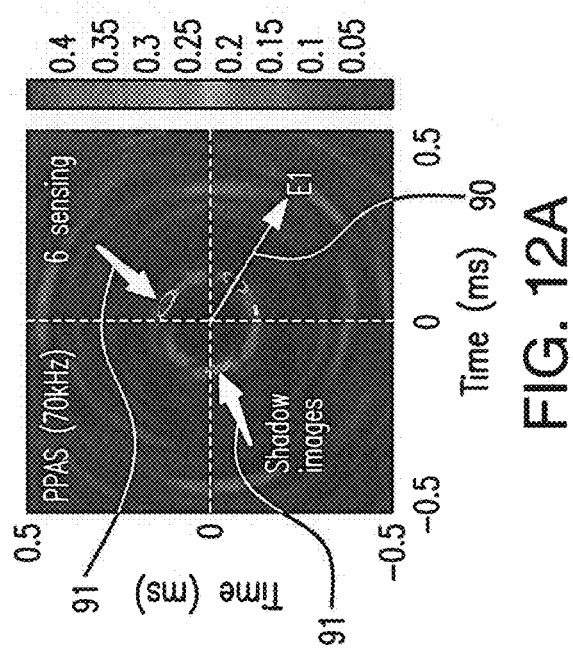
Figure 12C:
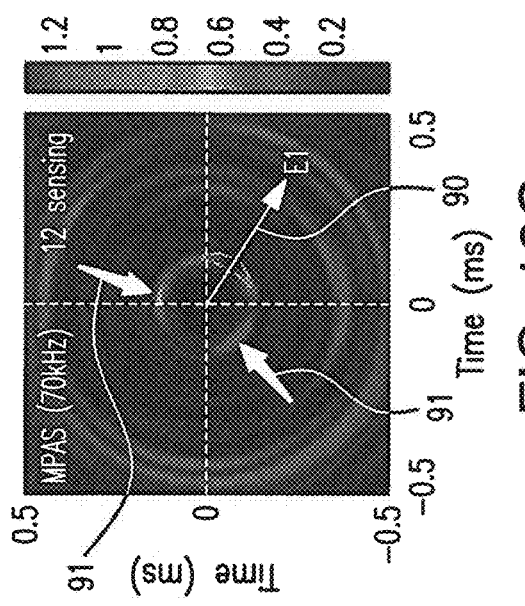

The 70 kHz GLW signal data (in the case of the E1 PZT actuation) was evaluated by the phased array signal processing technique to validate the directional wavenumber filtering algorithm. The resultant array images for the PPAS and MPAS with 6 and 12 sensing signal data were determined as shown in FIGS. 12A-12C. The 12 sensing signal data were obtained from the MPAS 10 with the original and the 30° alternative rotated conditions of the mobile magnetic circuit device.

The S1 sensing coil was primarily aligned to 225° direction for the original state of the MPAS. The GLW source location was identified from the array image results shown in FIGS. 12A-12C, illustrating array images evaluated by using the 70 kHz baseline GLW signal data obtained from the PPAS (FIG. 12A), the MPAS based on the original 6 sensing signal data (FIG. 12B), and MPAS with 12 sensing signal data (FIG. 12C) for the cases of the original and 30° rotated orientations. The off-centered E1 PZT actuator location was indicated as the line arrow 90 in FIGS. 12A-12C.

The distance and direction estimations from the array images agree with the actual E1 PZT actuator location. The arrows 91 in FIGS. 12A-12C indicate unwanted shadow waveform images, corresponding to the actual waveform by the E1 PZT actuation, due to the sidelobe effect of the phased array signal processing using the circular array configuration.

Except for the indicated shadow waveform images, there are other multiple shadow waveform images associated with the GLWs reflected from structural boundaries (such as the installed joint bolts and the edges and corners of the plate). As shown in FIGS. 12A-12B, the amplitude level of one shadow image is similar to that of the actual waveform for the E1 PZT actuator, and this drawback in case of the 6 sensor-based phased array system makes the GLW analysis difficult to assess the structural integrity.

However, FIG. 12C demonstrates that the same MPAS with the doubled sensing signal data can noticeably reduce the scale of the shadow images, so that the actual waveform image related to the E1 PZT actuation apparently stands out in the array image and the directional wavenumber filtering algorithm is verified by the results. The residual shadow images for both the PPAS and MPAS with 6 sensing signal data directions were not produced by the phased array signal processing algorithm, but due to the phased array configuration based only on the 6 sensors.

Loosened Joint Bolt Damage Detection

For the damage detection demonstration, the E0 PZT disc was utilized as the GLW actuation source, located at the center of the PPAS, as shown in FIGS. 8 and 9A-9B. The PZT actuator and the array sensors are collocated at the center of the testing plate 66, so that the array image after the phased array signal processing directly displays the associated structural damage features such as location and severity. If using the off-center E1 PZT disc as the GLW actuator, however, an additional analysis technique based on the center location information of the PZT actuator and the array sensor is necessary to accurately identify the damage location in the resulting array images.

FIGS. 13A-13F illustrate the differential array images for the Dam1 case corresponding to the fully loosened joint bolt along 270° direction in the cases of 70 kHz and 80 kHz excitation frequencies acquired by the PPAS (FIGS. 13A, 13D), MPAS based on the original 6 sensing signal data (FIGS. 13B-13C), and MPAS with 12 sensing signal data from the original and 30° rotated orientations of the magnetic circuit device (FIGS. 13C, 13F).

The differential array images were determined to emphasize the GLW interactions with the structural damage by subtracting damage array images from baseline array images as presented in FIG. 10. The GLW signal data for the 70 kHz and 80 kHz excitation frequencies were evaluated for the Dam1 case. As shown in FIGS. 13C and 13F, the MPAS array images based on the 12 sensing data exposes the direct GLW reflection from the Dam1 loosened joint bolt, while it was difficult for the PPAS and MPAS using the 6 sensor data to identify the Dam1 reflection waveform due to the numerous shadow waveform images and their superposition in the array response results. FIG. 13F demonstrates that the 80 kHz toneburst input signal to the PZT actuator generates GLWs with a smaller wavelength than the 70 kHz case, leading to producing an effective array response with less intensive shadow waveform images. Such wavelength influence on the phased array imaging may be dependent on the spacing between the individual sensors of the MPAS.

The Dam2 case of the loosened joint bolt along ~225° direction was additionally investigated by using the E0 PZT actuator. The resulting array images for 80 kHz GLW signals obtained from the MPAS and PPAS were evaluated as shown in FIGS. 14A-14C, which illustrate a differential array images for the Dam2 loosened bolt in the case of 80 kHz excitation frequency obtained with the PPAS (FIG. 14A), MPAS based on the original 6 sensing signal data (FIG. 14B), and MPAS with 12 sensing signal data from the original and 30° rotated orientations of the magnetic circuit device (FIG. 14C).

Figure 14A:
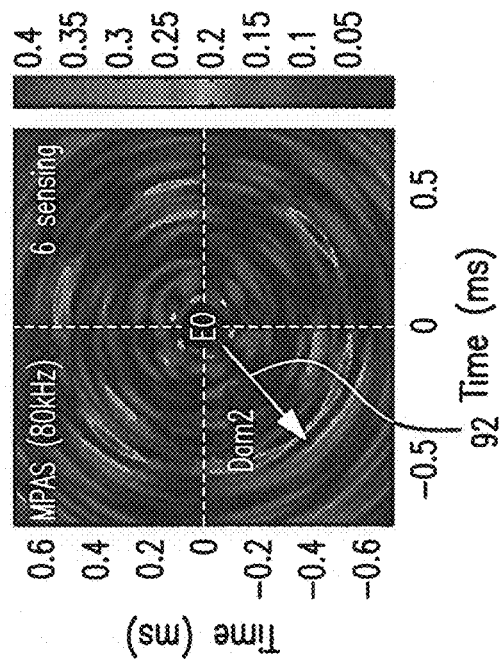
FIGS. 14A-14C are diagrams representative of the differential phased array images for the Dam2 loosened bolt in the case of 80 kHz excitation frequency for PPAs (FIG. 14A), the subject MPAS based on the original six sensing signal data (FIG. 14B), and for the subject MPAS with twelve sensing signal data from the original and 30° rotated orientations of the magnetic circuit device (FIG. 14C)
Figure 14B:
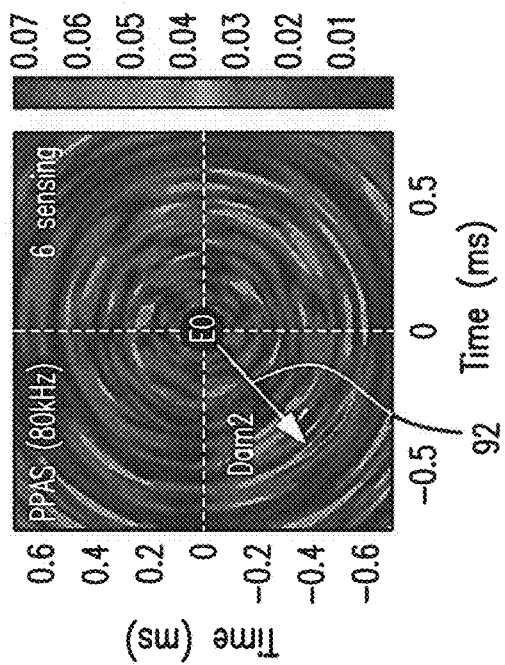
Figure 14C:
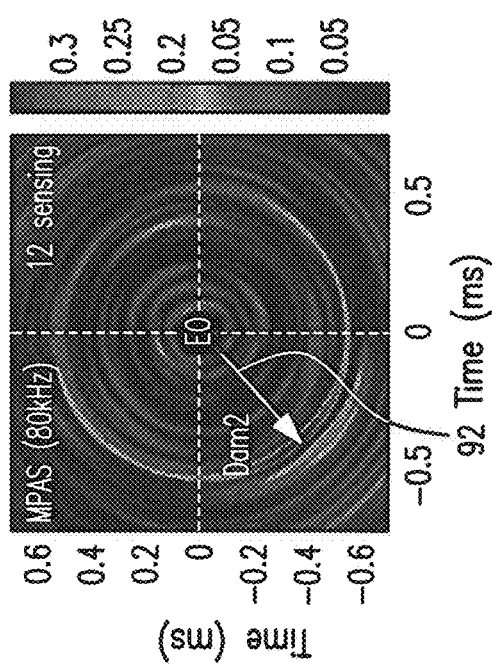

The line arrows 92 in FIGS. 14A-14C indicate the Dam2 location and its direction with respect to the E0 PZT actuator. Based on the images, the PPAS seems to have found the Dam2 joint bolt (FIG. 14A), but the associated array image result is inaccurate compared to the estimated damage location by the MPAS using the 12 sensing signal data (FIG. 14C). FIG. 14B demonstrates that by using the MPAS with the 6 sensing data limitation, the Dam2 joint bolt is unable to be diagnosed because of the numerous shadow waveform image presences in the final differential array image.

Similar to the Dam1 case, the MPAS using the 12 sensing signal data can successfully identify the loosened joint bolt as shown in FIG. 14C, but the Dam2 reflection waveform appears to have a much broader area than the actual size of the loosened joint bolt.

Integrating multiple array images for various excitation frequency cases may help to improve the array imaging result for damage analysis. To perform the integration process, the time-domain array image should be converted to a space domain image, based on the travel speed of the GLWs in the plate structure.

Figure 15:
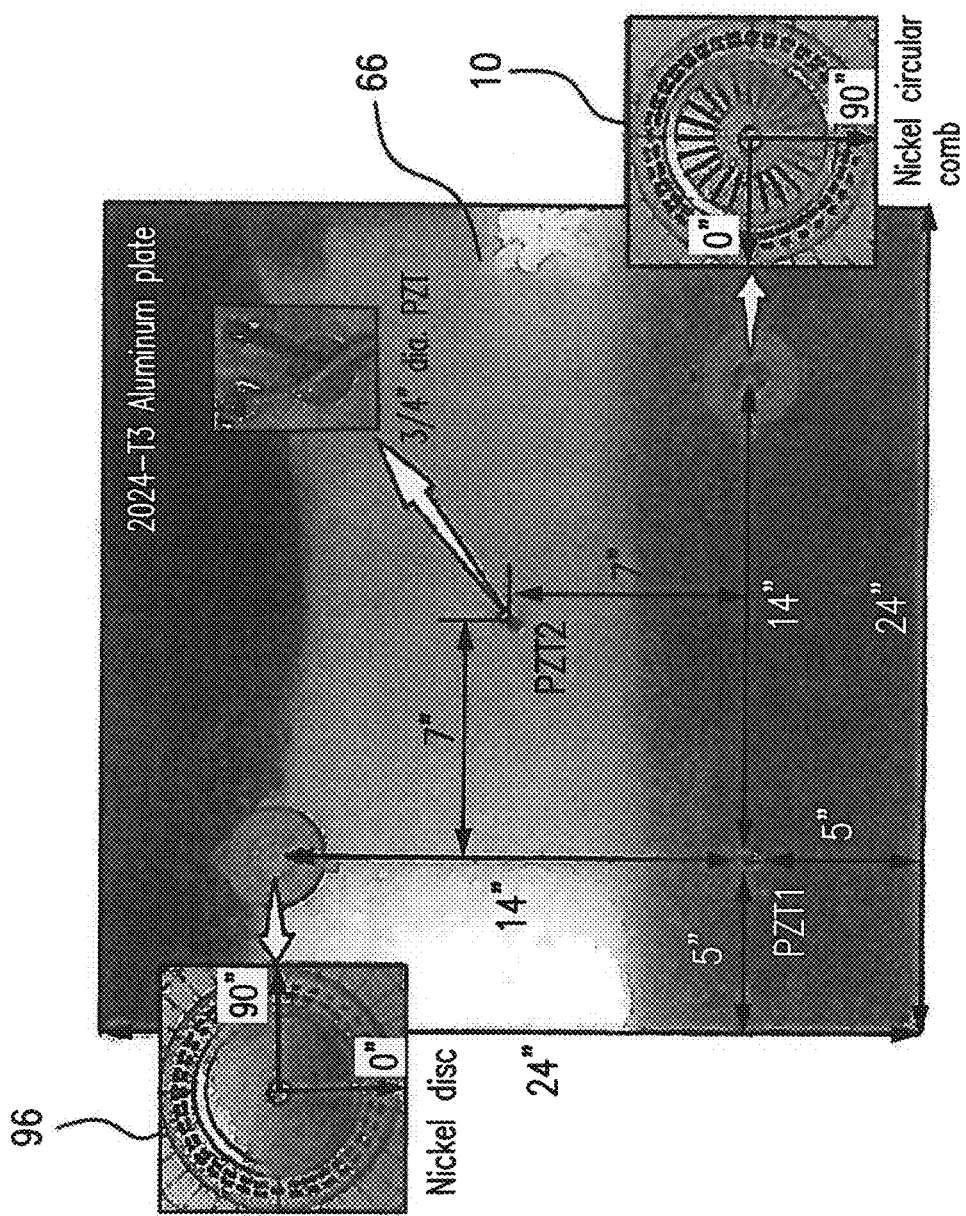
FIG. 15 shows an experimental setup for comparative measurements with the subject MPAS and a transducer with a disc-shaped patch.

FIG. 15 illustrates an experimental set-up for verification of the enhanced and improved MPAS operability when using the comb-shaped structure in comparison with the nickel disc patch. The polycrystalline nickel was used as magnetostrictive patch material for providing negative magnetostriction. Alternative choices for nickel may be iron-cobalt or iron-galfenol alloys having relatively higher magnetostriction characteristics.

Two nickel patches, i.e., disc 96 and the subject MPAS 10 with circular comb-shaped patch have been surface bonded to the aluminum plate 66 under study at symmetric locations. The disc patch 96 was used for result comparison to validate the benefits of the use of the subject comb-based patch in the subject MPAS 10.

Two ¼" in diameter PZT discs were used to generate omnidirectional guided waves in the plate under study (at two different locations). These PZT discs are indicated as PZT 1 and PZT 2 in FIG. 15.

The subject MPAS demonstrates its improved sensing capability by detecting the guided wave actuation sources and the reflected guided waves from the boundaries of the plate structure under test.

Figure 16A:
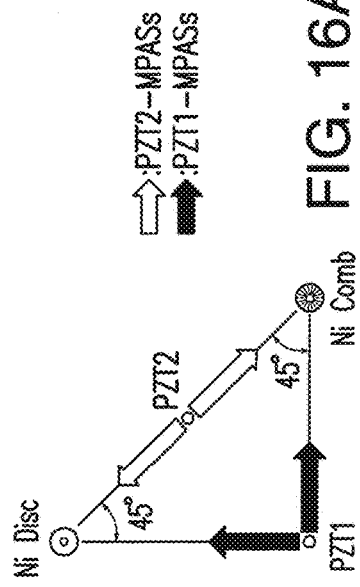
FIG. 16A shows travel paths of the guided waves in the setup of FIG. 15.
Figure 16C:
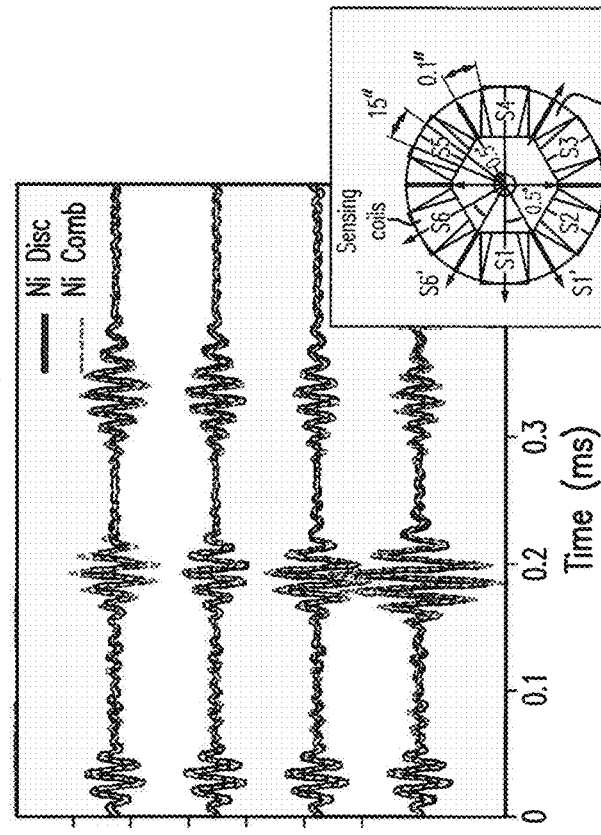
FIG. 16B-16C are diagrams of the acquired guided wave signals with the disc-based sensor and the subject MPAS for PZT1 (FIG. 16B) and PZT2 (FIG. 16C), respectively.
Figure 16B:
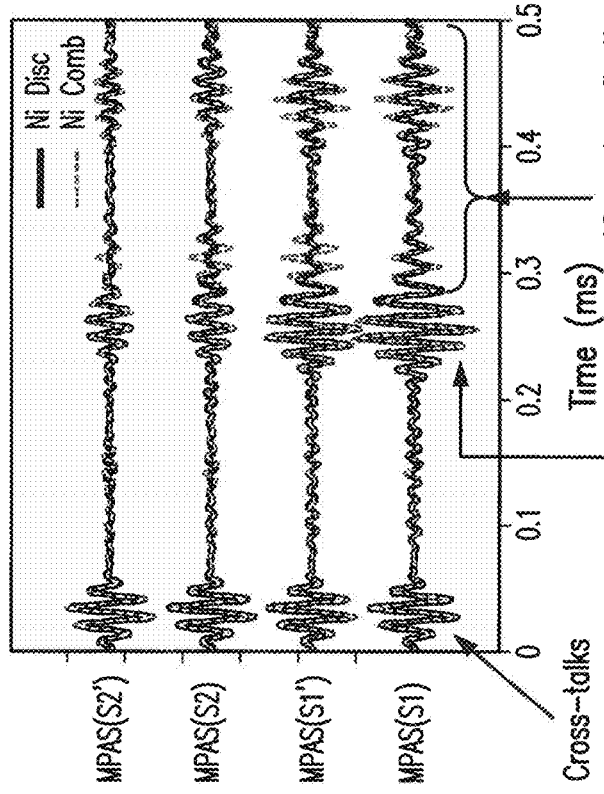
Figure 17A:
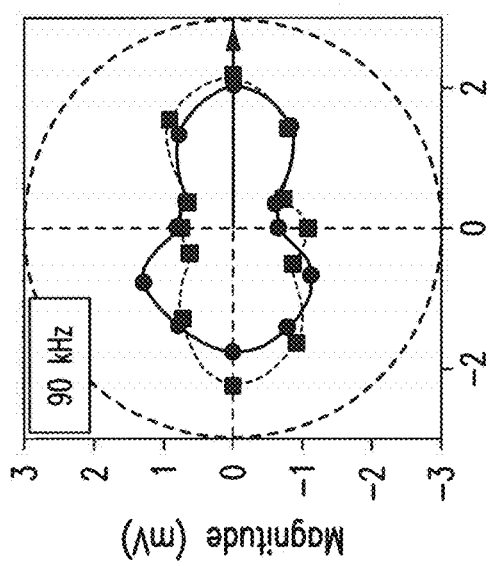
FIG. 17A-17D are diagrams representative of comparative analysis of the directional sensitivity of the disc patch sensor vs. the subject MPAS for PZT1 actuator (FIGS. 17A-17B), and PZT2 actuator (FIGS. 17C-17D) for 70 and 90 kHz, respectively.
Figure 17B:
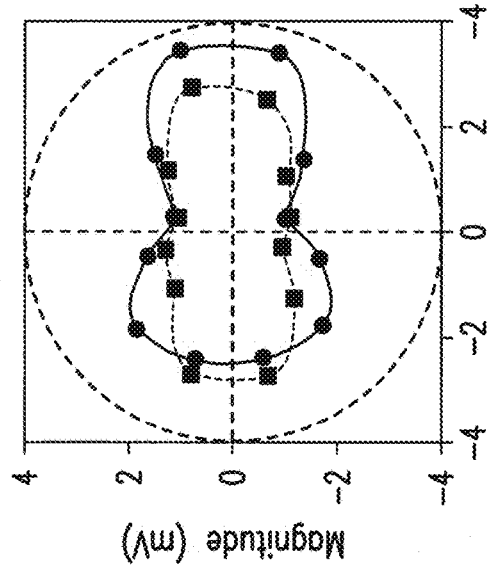
Figure 17C:
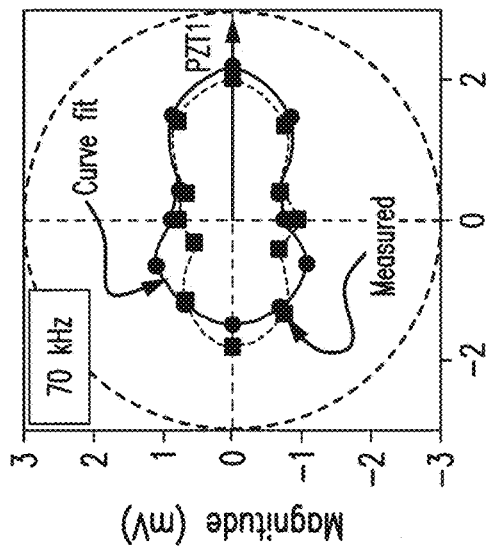
Figure 17D:
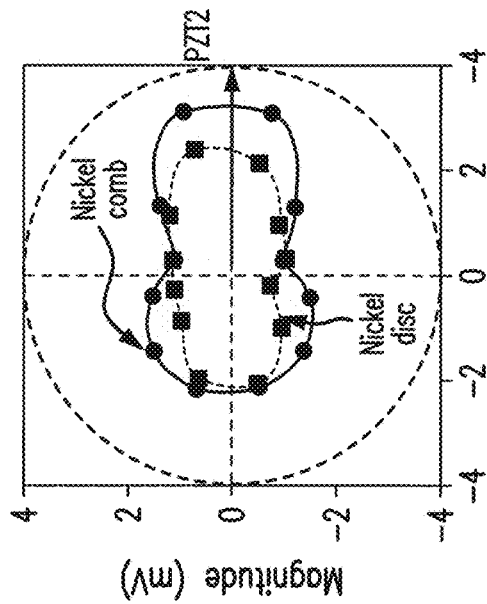

FIG. 16A illustrates schematically the positioning of the PZT 1 and PZT 2 as well as the disc sensor and comb-shaped patch-based sensor used in the experimental set-up illustrated in FIG. 15. FIGS. 16B and 16C show the guided wave signal data obtained from the disc-based sensor and the comb-shaped based sensor for the 70 kHz excitation signal from PZT 1 and 70 kHz excitation signal from PZT 2, respectively. The guided wave signals were successfully acquired by the MPAS using nickel disc and comb-based patch while using PZT 1 or PZT 2 as actuators individually.

As can be seen in FIGS. 16B and 16C, different wave signal patterns have been found for the two types of nickel patches. The diagrams show the signals acquired from the subject MPAS with original orientation S1-S2 and S1'-S2' representing signals acquired from the subject MPAS with 30° alternative rotated orientation.

FIGS. 17A through 17D are representative of directional sensitivity evaluation of operation of the subject MPAS using the comb-based patch vs. (in comparison to) the disc patch-based sensor.

The directional sensitivity was determined based on the amplitude of the first arrival waveform in wave signals. Two PZT actuators (PZT 1 and PZT 2) were used individually as source of the guided Lamb waves.

For a nickel disc patch, symmetrical directional sensitivity along the PZT actuator and its opposite directions provides an unclear wave in community direction. Quite to the contrary, for the subject MPAS using comb-shaped patch, the diagrams showed apparent directional sensitivity to the PZT actuator direction.

FIG. 18A is representative of schematic diagram showing sample travel passes of guided waves for the comb-shaped patch based sensor and the disc patch sensor. FIGS. 18B and 18C are representative of phased array images for the comb-shaped patch-based sensor with PZT 1 as an actuation source (FIG. 18B) and PZT 2 as an actuation source (FIG. 18C).

Wave number filtering technique was used to determine array images. Guided wave actuation source and reflection detection by the MPAS using the nickel comb-shaped patch-based sensor is presented in FIGS. 18B and 18C. Guided wave measurement data were acquired from 12 sensing positions within the nickel comb-shaped patch based sensor by using the shaded MPAS with original 30° rotational orientations.

FIGS. 19A-19D are representative of phased array images which were compared to highlight the virtue of the circular comb-shaped patch-based sensor. Comparison of the FIGS. 19A-19B (for the disc-shaped patch) with FIGS. 19C-19D (for the comb-shaped patch-based sensor) exhibits improved sensing performance and directional sensitivity indicated by arrows 100 in FIGS. 19C-19D.

FIGS. 20A-20D are representative of phased array images compared in order to highlight the virtue of the subject MPAS with its sensing position multiplication capability. As presented by comparison FIGS. 20A-20B (for only 6 sensing positions) with FIGS. 20C-20D (corresponding to 12 sensing positions), the significant improvement of the image resolution of the phased array sensor was attained due to the increased number of the sensing positions by simply altering the rotational orientation of the magnetic circuit device as evidenced by the shadow images diminishing as presented in FIGS. 20A-20D by arrows 102.

The structural health monitoring using the subject directional ultrasonic guided wave magnetostrictive phased array sensor (MPAS) is applicable in identification of various structural damages such as cracks, holes, loosened bolts, etc., as evidenced from the experimental studies presented in previous paragraphs. The use of the circular comb-shaped magnetostrictive patch improves the GW sensing performance and directionality of the MPAS due to magnetic shape anisotropy aspects of the high-aspect-ratio comb fingers.

The detachable magnetic circuit device encloses a number (3, 4, or 6) sensing coils and cylindrical biasing magnets. The individual sensing coils are aligned to different azimuthal directions which are considered GW sensing preferred orientations, leading to beneficial directional sensing capability of the subject MPAS.

The overall directional sensing feature of the developed MPAS is supported by the combined effect of the magnetic shape anisotropy of the comb-shaped fingers formation in the magnetostrictive patch and the sensing directionality of the coil sensing array. The MPAS measures the strain-induced magnetic property change on the comb-shaped patch due to the mechanical interaction between the magnetostrictive patch and GWS travelling in the waveguide structure under study.

Although the subject MPAS includes only a predetermined number of physical sensors (sensing coils), a sensor enables to multiply GW signal data from additional sensing sections within the patch by merely altering the rotational orientation of the magnetic circuit device. Consequently, the subject MPAS is capable of providing extremely high resolution damage detection images.

Although this invention has been described in connection with specific forms and embodiments thereof, it will be appreciated that various modifications other than those discussed above may be resorted to without departing from the spirit or scope of the invention as defined in the appended claims. For example, functionally equivalent elements may be substituted for those specifically shown and described, certain features may be used independently of other features, and in certain cases, particular locations of elements, steps, or processes may be reversed or interposed, all without departing from the spirit or scope of the invention as defined in the appended claims.

What is claimed is:

1. A directional magnetostrictive phased array sensor (MPAS), comprising:
   an annularly-contoured comb-shaped patch member formed from a magnetostrictive material and configured with a first plurality of comb finger members extending radially at the periphery of said patch member;
   a magnetic circuit unit removably attached to said patch member along a central axis thereof in an angularly displaceable relationship with said patch member about a rotational axis of said magnetic circuit unit, said rotational axis of said magnetic circuit unit coinciding with said central axis of said patch member,
   wherein said magnetic circuit unit is configured with:
   a second plurality of sensing coils extending radially along a respective longitudinal axis thereof in a spaced apart angular relationship one with another, each of said second plurality of sensing coils having a respective sensing direction along said respective longitudinal axis thereof, and
   at least two cylindrically-shaped biasing magnets installed in said magnetic circuit unit along said rotational axis thereof, said biasing magnets generating a static magnetic field in said patch member;
   wherein said patch member, being attached to a structure under study, undergoes a deformation caused by guided waves propagating in the structure under study, resulting in generation of a strain-induced dynamic magnetic field coupled to said sensing coils, wherein a change detected in said generated dynamic magnetic field measured for at least two sensing directions of said magnetic circuit unit is representative of the presence of irregularities in the structure under study.

2. The directional MPAS of claim 1, further comprising a rotating mechanism operatively coupled to said magnetic circuit unit for controllable rotation of said magnetic circuit unit relative to said patch member.

3. The directional MPAS of claim 2, wherein said rotating mechanism controls the sensing position of said sensing coils relative to said structure under study, thus establishing various directional orientations of respective sensing coils for measuring said dynamic magnetic field induced in said patch member and coupled to said respective sensing coils in said respective sensing directions thereof, said various directional orientations for measuring said dynamic magnetic field including directions angularly spaced apart an angle smaller than the angular displacement between adjacent sensing coils in said magnetic circuit unit.

4. The directional MPAS of claim 3, wherein said rotating mechanism angularly displaces said magnetic circuit unit to measure said dynamic magnetic field in a number of directions including at least double of said second plurality of said sensing coils in said magnetic circuit unit.

5. The directional MPAS of claim 1, wherein said magnetostrictive material is selected from a group including nickel, iron, cobalt, iron-gallium (Galfenol), iron-cobalt, alloys thereof and combinations thereof.

6. The directional MPAS of claim 1, wherein said patch member is configured with at least 24 comb finger members equidistantly spaced apart along said periphery of said patch member.

7. The directional MPAS of claim 1, wherein said second plurality of sensing coils includes at least 3 coils.

8. The directional MPAS of claim 2, wherein said rotating mechanism includes a ring gear operatively coupled to said magnetic circuit unit, a stepper motor, and a motor gear of said stepper motor engaged with said ring gear, wherein said stepper motor is controllably actuated to control the directional orientation of said magnetic circuit unit.

9. The directional MPAS of claim 1, wherein said guided waves include guided Lamb waves, said guided Lamb waves propagating in the structure under study are reflected from an irregularity in the structure under study towards at least said patch member, thus changing said dynamic magnetic field produced in said patch member due to the magnetostrictive mechanism, thereby indicating presence and location of the irregularity.

10. The directional MPAS of claim 1, wherein said magnetic circuit unit further includes coil bobbins, each coil bobbin being configured with a central portion formed with a passage and two ending portions attached to said central portion at opposing sides thereof, a pair of said sensing coils being wound on ending portions of each coil bobbin, wherein said coil bobbins are assembled in a stuck formation with said central passages thereof aligned along said rotational axis of said magnetic circuit unit, and wherein said biasing magnets are disposed in said aligned passages of said coil bobbins.

11. The directional MPAS of claim 1, further including an upper cover and a bottom cover engaged, at the peripheries thereof, and housing said magnetic circuit unit therebetween.

12. A system for structural health monitoring, using a directional magnetostrictive phased array sensor (MPAS), comprising:
 an annularly-contoured comb-shaped patch member, formed of a magnetostrictive material and configured with a first plurality of comb finger members extending radially along the periphery of said patch member;
 a magnetic circuit unit removably attached to said patch member along a central axis thereof and angularly displaceable relative thereto about a rotational axis of said magnetic circuit unit, said rotational axis of said magnetic circuit unit coinciding with said central axis of said patch member,
 wherein said magnetic circuit unit is configured with a second plurality of sensing coils extending radially along a respective longitudinal axis thereof in a spaced apart angular relationship one with another in said magnetic circuit unit, each of said second plurality of sensing coils having a sensing direction coinciding with said longitudinal axis thereof, and
 at least a pair of biasing cylindrically-shaped magnets installed in said magnetic circuit unit along said rotational axis thereof, said biasing magnets generating a static biasing magnetic field in said patch member;
 a source of ultrasonic excitation; and
 a signal data acquisition sub-system operatively coupled to said magnetic circuit unit to obtain signals generated thereat;
 wherein, for the structural health monitoring, said comb-shaped patch member is attached to a structure under study with said sensing coils controllably positioned in at least two predetermined angularly spaced apart sensing directions, and
 wherein said source of ultrasonic excitation is operatively coupled to the structure under study to generate guided Lamb waves (GLWs) propagating in said structure under study, said GLWs causing a deformation in said patch member attached thereto, resulting in generation of a respective strain-induced dynamic magnetic field in said patch member at each of said at least two predetermined sensing directions, and coupling of said generated dynamic magnetic field to said sensing coils; and
 wherein said signal data acquisition sub-system measures said strain-induced dynamic magnetic field generated at each of said at least two predetermined directions as an output on respective ones of said sensing coils, and indicates the presence of an irregularity in the structure under study if a change of the dynamic magnetic field between said at least two sensing directions is detected.

13. The directional MPAS of claim 12, further comprising a rotating mechanism operatively coupled to said magnetic circuit unit for controllable rotation of said magnetic circuit unit relative to the structure under study, wherein said rotating mechanism includes a ring gear operatively coupled to said magnetic circuit unit, a stepper motor, and a motor gear of said stepper motor operatively engaged with said ring gear, wherein said stepper motor is controllably actuated to control the directional orientation of said magnetic circuit unit.

14. The directional MPAS of claim 13, wherein said rotating mechanism controls directional orientation of measuring said dynamic magnetic field induced in said patch member and coupled to respective sensing coils for measuring said dynamic magnetic field in various directions including at least one direction displaced from another direction an angle smaller than the angular displacement between adjacent ones of said sensing coils.

15. The directional MPAS of claim 12, wherein said magnetostrictive material is selected from a group including nickel, iron, cobalt, iron-gallium (Galfenol), iron-cobalt, alloys thereof, and combinations thereof.

16. The directional MPAS of claim 12, wherein said guided waves include guided Lamb waves, said guided Lamb waves propagating in the structure under study are reflected from an irregularity in the structure under study towards said patch member, thus changing said dynamic magnetic field produced in said patch member due to the magnetostrictive mechanism, thereby indicating presence and location of the irregularity.

17. A method for structural health monitoring using a magnetostrictive phased array sensor (MPAS), comprising the steps of:
 (a) establishing a MPAS configured with a circular comb-shaped patch member manufactured from a magnetostrictive material and formed with a first plurality of comb fingers extending radially along the periphery of said patch member, and
 a magnetic circuit unit attached to said patch member along a central axis thereof and rotationally displaceable relative thereto about a rotational axis of said magnetic circuit unit, said rotational axis of said magnetic circuit unit coinciding with said central axis of said patch member,
 wherein said magnetic circuit unit is configured with a second plurality of sensing coils extending radially in said magnetic circuit unit in a predetermined spaced apart angular relationship one with another, each of said second plurality of sensing coils having a sensing direction coinciding with the longitudinal axis thereof, and
 at least a pair of biasing cylindrically shaped magnets installed in said magnetic circuit unit along said rotational axis thereof, said biasing magnets generating a static biasing magnetic field induced in said sensing coils;
 (b) coupling a source of ultrasonic excitation to a structure under study;
 (c) attaching said comb-shaped patch member of said MPAS to the structure under study;
 (d) operatively coupling a signal data acquisition sub-system to said magnetic circuit unit;
 (e) subsequently positioning said magnetic circuit unit in at least first and second measuring directions with said sensing direction of a respective sensing coil in each of said at least first and second measuring directions being angularly displaced one from another;
 (f) activating said source of ultrasonic excitation to generate guided Lamb waves (GLWs) propagating in the structure under study, thus causing a deformation in said patch member attached thereto and generating a respective strain-induced dynamic magnetic field on said patch member coupled to said respective sensing coil;
 (g) measuring, at each of said at least first and second measuring directions, said strain-induced dynamic magnetic field coupled to said respective sensing coil; and
 (h) indicating the presence of an irregularity in the structure under study if a change of the dynamic magnetic field between said at least first and second measuring directions has been detected.

18. The method of claim 17, further comprising the steps of:
- in said step (e), coupling a rotating mechanism to said magnetic circuit unit for controllable rotation of said magnetic circuit unit relative to said patch member,
- configuring said rotating mechanism with a ring gear operatively coupled to said magnetic circuit unit, a stepper motor, and a motor gear of said stepper motor engaged with said ring gear; and
- controllably actuating said stepper motor to control the directional position of said magnetic circuit unit.

19. The method of claim 17, further comprising the step of:
- in said step (e), controlling the positioning of said magnetic circuit unit by said rotating mechanism for measuring the dynamic magnetic field induced in said patch member and coupled to said sensing coils in various directions including measuring directions displaced from said at least first and second measuring directions an angle smaller than the angular displacement between adjacent of said sensing coils in said magnetic circuit unit.

20. The method of claim 17, further comprising the step of:
- in said step (e), wherein said second plurality of sensing coils includes six sensing coils, measuring said dynamic magnetic field in at least twelve positional orientations.

\* \* \* \* \*